(12) United States Patent
Ogawa et al.

(10) Patent No.: US 6,577,490 B2
(45) Date of Patent: Jun. 10, 2003

(54) WIRING BOARD

(75) Inventors: Kouki Ogawa, Ichinomiya (JP);
Yasuhiro Sugimoto, Kohnan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/183,521

(22) Filed: Jun. 28, 2002

(65) Prior Publication Data

US 2002/0159243 A1 Oct. 31, 2002

Related U.S. Application Data

(63) Continuation-in-part of application No. 10/012,312, filed on Dec. 12, 2001, now abandoned.

(30) Foreign Application Priority Data

Dec. 12, 2000 (JP) ........................... 2000-377926
Dec. 28, 2000 (JP) ........................... 2000-402498
Nov. 30, 2001 (JP) ........................... 2001-367688

(51) Int. Cl.[7] ............................................. H01G 4/228
(52) U.S. Cl. ..................... 361/306.1; 361/766; 174/260
(58) Field of Search ..................... 361/321.2, 306.1, 361/328, 309, 310, 766, 760, 807; 174/260, 263

(56) References Cited

U.S. PATENT DOCUMENTS 5,027,253 A * 6/1991 Lauffer et al. ........... 361/321.4
6,195,260 B1 * 2/2001 Moriyama ................. 361/749
6,333,857 B1 * 12/2001 Kanbe et al. .............. 361/792
6,388,207 B1 * 5/2002 Figueroa et al. ........... 174/262

* cited by examiner

*Primary Examiner*—Anthony Dinkins
(74) *Attorney, Agent, or Firm*—Sughrue Mion, PLLC

(57) ABSTRACT

A wiring board simplifying connection of electronic parts mounted on a principal face side of the wiring board and chip capacitors mounted on a reverse face side thereof in such a manner that the wiring board 100 mounting the chip capacitors 160 on a reverse face 101c-side comprises bumps 129 capable of being connected to IC chip 10, first and second capacitor connecting pads 149p, 149g connecting the upper face parts 163 of the chip capacitors 160, a plurality of insulating layers 121, 111, 141 intervening the first and the second capacitor connecting pads, and first and second converting-conductor layers 146p, 146g in stripe pattern formed at interlayer 152, connected to the bumps 129 at the principal face 101b-side, connected to the first capacitor connecting pads 149p at the reverse face 101c-side or the second capacitor connecting pads 149g for changing the connecting positions or the connecting number between the principal face side and the reverse face side.

16 Claims, 22 Drawing Sheets

WIRING BOARD

This application is a CIP of Ser. No. 10/012,312 filed Dec. 12, 2001 which is now abandoned.

TECHNICAL FIELD OF THE INVENTION

The present invention relates to a wiring board for mounting electronic parts, and in particular to a wiring board mounting chip capacitors on a reverse face side.

BACKGROUND OF THE INVENTION

IC chips has become higher speed in actuation owing to progress of technique of integrated circuit, and being accompanied therewith, noises are accumulated on such as wiring of electric source and bring about erroneous actuation. For removing noises, for example, as seen in FIG. 22, a wiring board 2 mounting IC chip 1 thereon is separately mounted with chip capacitors 3 on a principal face 2b or a reverse face 2c, and capacitor-connecting wiring 4 is provided within the wiring board for respectively connecting two electrodes of the capacitors 3. Thereby, the chip capacitors 3 are connected to a source terminal or an earth terminal of IC chip 1 via the capacitor-connecting wiring 4 and flip-chip pad 5.

However, depending on the above technique, the capacitor-connecting wiring 4 connected to the chip capacitors 3 are drawn around within the wiring board 2. When changing positions of terminals of IC chip 1, it has been necessary to re-design a whole wiring including the capacitor-connecting wiring 4. Especially, IC chip of high integration degree is often formed with lots of source terminals and earth terminals, and the drawing-around is easily subject to complication. In addition, in case of mounting many chip capacitors or connecting the chip capacitors having many terminals, the drawing-around also becomes complicated.

SUMMARY OF THE INVENTION

The invention has been accomplished in view of these problems, and it is an object of the invention to provide a wiring board making ready for connecting electronic parts mounted on the principal face side of the wiring board with chip capacitors mounted on the reverse face side thereof.

Means for solving the problems is a wiring board having a principal face and a reverse face, comprising a plurality of principal-face-side connecting terminals formed on the principal face side and connectable to respective terminals of electronic parts to be mounted on the principal face side, chip capacitors mounted on the reverse face side furnished with a first electrode and a second electrode composing capacitors, at least one of the chip capacitors having a first face facing to the reverse face, at least one of first terminals formed on the first face and connected to the first electrode, and at least one of second terminals formed on the first face and connected to the second electrode, first capacitor-connecting terminals formed on the reverse face side and connected to the respective first terminals of the chip capacitors, second capacitor-connecting terminals formed on the reverse face side and connected to the respective second terminals of the chip capacitors, a plurality of insulating layers interposed among the principal-face-side connecting terminals, the first capacitor-connecting terminals, and the second capacitor-connecting terminals, at least one of first converting-conductor layers formed at specific interlayer selected from interlayers of the mutual insulating layers, connected to the plurality of principal-face-side connecting terminals at the principal face side, connected to at least one of first capacitor-connecting terminals at the reverse face side, and changing the connecting positions and the connecting number between the principal face side and the reverse face side, and at least one of second converting-conductor layers formed at the specific interlayer while being insulating the first converting-conductor layers, connected to the plurality of principal-face-side connecting terminals at the principal face side, connected to at least one of second capacitor-connecting terminals at the reverse face side, and changing the connecting positions and the connecting number between the principal face side and the reverse face side.

The wiring board of the invention is formed with the first and the second converting-conductor layers for changing the connecting positions and the connecting number between the principal face side and the reverse face side at the same specific interlayer. The first converting-conductor layers are connected to the principal-face-side connecting terminals at the principal face side, and to the first capacitor-connecting terminals at the reverse face side. Further, the second converting-conductor layers are connected to the principal-face-side connecting terminals at the principal face side, and to the second capacitor-connecting terminals at the reverse face side. Therefore, the connection between the principal-face-side connecting terminals and the first and second capacitor-connecting terminals is easily provided. Accordingly, the connection between terminals of the electronic parts and the first and second terminals is easily made.

As the chip capacitors, any of them are sufficient if being able to be mounted on the wiring board. For example, there are enumerated laminated ceramic types, electrolytic capacitor types, or film capacitor types. In particular, the chip capacitors of the laminated ceramic type have desirable frequency characteristics, and being effected with heat, the characteristics are comparatively stable.

Besides, the first and second terminals formed on the first faces of the chip capacitors are preferably many formed. Because, by forming many, those may be connected in parallel with the first and second converting-conductor layers, and resistance and inductance occurring at wiring between the first, second converting-conductor layers and the chip capacitors may be more reduced. Therefore, the first and second terminals of the chip capacitors are sufficient with those formed on the periphery of the first face, but preferable are such terminals arranged in, e.g., lattice within the first face.

More preferable are that the first terminal and the second terminal are alternately arranged in a manner that, seeing from a certain first terminal, a nearest terminal to this first terminal is a second terminal. The current flowing via the first terminal and the current flowing via the second terminal are opposite to each other with regard to direction when charging and discharging the chip capacitors, and also in this regard, inductance can be decreased.

As the wiring board, there are listed resins such as epoxy resin, polyimide resin, BT resin or PPE resin, composite materials of fibers such as glass fiber or polyester fiber with the resins, or resin composite materials of fluorine resin having three dimensional network structure impregnated with epoxy resin. Further listed are ceramic boards made of alumina, mullite, aluminum nitride or glass ceramic, or combinations of the ceramic board with the resins or composite materials.

Around the principal-face-side connecting terminals and the first and the second capacitor-connecting terminals, solder resist layers may be formed for securing the mutual insulation and preventing solder wetted spread.

In the wiring board as mentioned above, it is preferred that as the specific interlayer, the nearest interlayer to the first capacitor-connecting terminals and the second capacitor-connecting terminals among the interlayers of the mutual insulating layers are selected, and the number of the principal-face-side connecting terminals connected to any of the first converting-conductor layers and the second converting-conductor layers of the principal-face-side connecting terminals is more than the sum of the number of the first capacitor-connecting terminals connected to the first converting-conductor layers+(plus) the number of the second capacitor-connecting terminals connected to the second converting-conductor layers.

The wiring of connecting the principal-face-side connecting terminals and the first, second capacitor-connecting terminals (the first and the second terminals of the chip capacitors) can restrain resistance value and inductance, the more the parallel paths. Accordingly, seeing from the first and the second converting-conductor layers, a comparison is made between the number of the principal-face-side connecting terminals connecting therewith and the number of the first and the second capacitor-connecting terminals (the sum of the number of the first capacitor-connecting terminals+(plus) the number of the second capacitor-connecting terminals), and if shortening the wiring of the less number side, the wiring is advantageous with respect to resistance and inductance. Therefore, in case the number of the principal-face-side connecting terminals connected to the first and the second converting-conductor layers is more than the number of the first and the second capacitor-connecting terminals, it is desirable to dispose the first and the second converting-conductor layers as near as possible to the first and the second capacitor-connecting terminals, that is, near to the chip capacitors.

Since the invention selects as the specific interlayer the nearest interlayer to the first capacitor-connecting terminals and the second capacitor-connecting terminals among the interlayers of the mutual insulating layers, there are accordingly nearest disposed the first and the second converting-conductor layers and the first and the second capacitor-connecting terminals. It is possible thereby to reduce resistance and inductance between the principal-face-side connecting terminals and the first, second terminals of the chip capacitors.

In the case of the wiring board mounting IC chips of high integration, the number of the principal-face-side connecting terminals is often many. In IC chips of high integration, lots of source terminals and earth terminals are equipped. Therefore, for mounting IC chips of high integration, it is preferable to apply the invention.

The wiring board is any of the mentioned above, and at least one part of the first capacitor-connecting terminals connected with the first converting-conductor layers at the reverse face side are positioned within such a range of projecting the connected first converting-conductor layers onto the first face, the first capacitor-connecting terminals and the first converting-conductor layers are connected through via-conductors passing the insulating layers, at least one part of the second capacitor-connecting terminals connected to the second converting-conductor layers at the reverse face side are positioned within such a range of projecting the connected second converting-conductor layers onto the first face, and the second capacitor-connecting terminals and the second converting-conductor layers are connected through the via-conductors passing the insulating layers.

In the wiring board of the invention, of the chip capacitors, at least one part of the first capacitor-connecting terminals connected to the first converting-conductor layers are positioned within the range of projecting the connected first converting-conductor layers onto the first face. Reversely to say, seeing from a certain first capacitor-connecting terminal, the first converting-conductor layers connecting thereto positions perpendicularly on the principal face side. The first capacitor-connecting terminals and the first converting-conductor layers are connected through the via-conductors having lower resistance and lower inductance than those of wiring layers formed between the insulating layers, specifically through the via-conductors passing the insulating layers toward the reverse face side from the first converting-conductor layers and extending vertically. Thus, the first capacitor-connecting terminals and the first converting-conductor layers may be connected at low resistance and low inductance.

Similarly, at least one part of the second capacitor-connecting terminals connected to the second converting-conductor layers at the reverse face side are positioned within the range of projecting the connected second converting-conductor layers onto the first face of the chip capacitors. Reversely to say, seeing from a certain second capacitor-connecting terminal, the second converting-conductor layers connecting thereto positions perpendicularly on the principal face side. The second capacitor-connecting terminals and the second converting-conductor layers are connected through the via-conductors passing the insulating layers toward the reverse face side from the first converting-conductor layers and extending vertically. Thus, the second capacitor-connecting terminals and the second converting-conductor layers may be also connected at low resistance and low inductance.

Further, another means for solving the problem is a wiring board having a principal face and a reverse face, comprising a plurality of principal-face-side connecting terminals formed on the principal face side and connectable to respective terminals of electronic parts mounted on the principal face, chip capacitors mounted on the reverse face side furnished with a first electrode and a second electrode composing capacitors, at least one of the chip capacitors having a first face facing to the reverse face, at least one of first terminals formed on the first face and connected to the first electrode, and at least one of second terminals formed on the first face and connected to the second electrode, at least one insulating layer interposed between the principal-face-side connecting terminals and first and second terminals of the chip capacitors, at least one of first converting-conductor layers formed on the reverse face of most-reverse face side insulating layer positioned on the most reverse face side among the insulating layers, connected to the plurality of principal-face-side connecting terminals at the principal face side, connecting directly or via conductive connecting materials with at least one of first terminals at the reverse face side, and changing the connecting positions and the connecting number between the principal face side and the reverse face side, and at least one of second converting-conductor layers formed at the reverse face side of the most-reverse face side insulating layer while being insulating the first converting-conductor layers, connected to the plurality of principal-face-side connecting terminals at the principal face side, connecting directly or via the conductive connecting materials with at least one of second terminals at the reverse face side, and changing the connecting positions and the connecting number between the principal face side and the reverse face side.

The wiring board of the invention is formed at the reverse face side of the most-reverse face side insulating layer with the first and the second converting-conductor layers for changing the connecting positions and the connecting number between the principal face side and the reverse face side. The first converting-conductor layers are connected to the principal-face-side connecting terminals at the principal face side and to the first terminals of the chip capacitors at the reverse face side. Further, the second converting-conductor layers are connected to the principal-face-side connecting terminals at the principal face side and to the second terminals of the chip capacitors at the reverse face side. Therefore, the connection between the principal face side terminals, and the terminals of the electronic parts and the first and second terminals is easily made.

Besides, the first and the second converting-conductor layers are formed at the reverse face side of the most-reverse face side insulating layer among the insulating layers disposed between the principal-face-side connecting terminals and the first, second terminals of the chip capacitors. So, the first and the second terminals of the chip capacitors and the first and the second converting-conductor layers become nearest, so that resistance and inductance occurring therebetween can be reduced to the minimum.

The first and second converting-conductor layers are connected to the first and the second terminals of the chip capacitors directly or via the conductive connecting materials, not via the via-conductors. Therefore, resistance and inductance created by the connection the first and the second terminals of the chip capacitors and the first and the second converting-conductor layers can be reduced to the minimum.

By the way, as the conductive materials, a solder or a conductive adhesive may be taken up. The solder may be selected taking material quality of the wiring board or the first and the second terminals into consideration, for example, there are Pb—Sn based or Sn—Sb based solders. As the conductive adhesive, for example, there are those dispersed in resins as epoxy resin with conductive fillers comprising carbon powder, metallic powder as silver, copper or nickel, resin particles covered with these metals, or glass particles.

The wiring board is as mentioned above, and the number of the principal-face-side connecting terminals connected to any of the first converting-conductor layers and the second converting-conductor layers of the principal-face-side connecting terminals is more than the sum of the number of the first terminals connected to the first converting-conductor layers+(plus) the number of the second terminals connected to the second converting-conductor layers.

The wiring of connecting the principal-face-side connecting terminals and the first, second terminals of the chip capacitors can restrain resistance value and inductance, the more the parallel paths. Accordingly, seeing from the first and the second converting-conductor layers, a comparison is made between the number of the principal-face-side connecting terminals connected to these converting-conductor layers and the number of the first and the second capacitor-connecting terminals, and if shortening the wiring of the less number side, the wiring is advantageous with respect to resistance and inductance. Therefore, in case the number of the principal-face-side connecting terminals connected to the first and the second converting-conductor layers is more than the number of the first and the second terminals, it is desirable to dispose the first and the second converting-conductor layers as near as possible to the first and the second terminals, that is, near to the chip capacitors.

In the invention, as mentioned above, the first and the second converting-conductor layers are formed at the reverse face side of the most-reverse face side insulating layer, and are connected to the first and the second terminals of the chip capacitors directly or via the conductive connecting materials, so that the first, second converting-conductor layers and the first, second terminals of the chip capacitors are disposed at the especially near position. Therefore, resistance and inductance between the principal-face-side connecting terminal and the first, second terminals of the chip capacitors can be particularly reduced.

In the case of the wiring board mounting IC chips of high integration, the number of the principal-face-side connecting terminals is often many. Because in IC chips of high integration, lots of source terminals and earth terminals are equipped. Therefore, for mounting IC chips of high integration, it is preferable to apply the invention.

The wiring board is any of the mentioned above, and the first converting-conductor layers and the second converting-conductor layers have parts of stripe patterns alternately arranged.

Of the connecting terminals of electronic parts as IC chip and the principal-face-side connecting terminal in response thereto, those connected to the first terminals of the chip capacitors (for example, those connected to source potential) and those connected to the second terminals (for example, those connected to earth potential) are near and often designed and disposed for parallel parts.

In contrast, the wiring board of the invention has the striped pattern parts in the first and the second converting-conductor layers. In the striped pattern parts, since the first and the second converting-conductor layers are adjacent, the principal-face-side connecting terminal extend the connecting wiring by use of the via-conductors toward the reverse face side in response to the terminals (either of the first terminals and the second terminals) of the chip capacitors, and as needed, the short wiring is formed between the mutual insulating layers so as to adjust the positions for connected to the objective first or second converting-conductor layers. In short, in the striped pattern parts, it is possible to easily connect the principal-face-side connecting terminal with any of the first and the second converting-conductor layers, and the wiring is ready for designing.

In particular, when the first and the second terminals are disposed alternately in the chip capacitors, the first terminals of the chip capacitors can be easily connected to the first converting-conductor layers in the striped pattern parts, while the second terminals of the chip capacitors can be easily connected to the second converting-conductor layers, thereby to make the wiring design easy. Besides, if the first and the second terminals of the chip capacitors are alternately arranged, inductance can be restrained and such arrangement is preferable to the current flowing, since inductance can be lowered by the opposite directions of the currents output from and input in the chip capacitors.

Further, the wiring board is as mentioned above, and the first converting-conductor layers and the second converting-conductor layers have parts where directions of current flowing when charging and discharging the chip capacitors are opposite to each other in the stripe pattern.

The wiring board of the invention has the currents-reverse-flowing parts, and in this part, the currents flowing directions are revered when charging and discharging the chip capacitors and cancel magnetic fields each other (negative mutual inductance occurs). Therefore, in this part, inductance is more restrained and as a whole inductance can be more lowered.

Preferably, there is provided a wiring board according to any one of the paragraphs described above, further having a cavity surrounding portion which is located on the reverse face side from the insulating layer and which constitutes a wall face of a cavity opened on the reverse face side, wherein: the first and second capacitor-connecting terminals are formed on a bottom face of the cavity; and the chip capacitors are mounted in the cavity so that the bottom face of the cavity is opposite to the first faces of the chip capacitors.

In the wiring board according to the invention, chip capacitors each having first and second terminals on its first face are mounted in the cavity. Hence, the chip capacitors are mounted so as to be substantially opposite to electronic parts mounted on the principal face of the wiring board, through the bottom face of the cavity. Hence, the distance between the principal face side connecting terminals of the wiring board and the first and second terminals of the chip capacitors can be shortened and, accordingly, the distance between the electronic parts mounted on the principal face and the chip capacitors can be shortened compared with a double-side laminated wiring board in which no cavity is formed.

Accordingly, the connecting terminals on the principal face side of the wiring board can be connected to the first and second terminals of the capacitors by short paths compared with the double-side laminated wiring board in which no cavity is formed, so that resistance components and inductance components generated on these paths can be suppressed.

Preferably, there is provided a wiring board further having a core substrate including a first core part located on the principal face side, and a second core part located from the first core part on the reverse face side, wherein: the first core part is contained in the insulating layer whereas the second core part is contained in the cavity surrounding portion; the insulating layer includes the first core part located on the most-reverse face side, and one insulating resin layer or a plurality of insulating resin layers laminated on the first core part toward the principal face side; and the cavity surrounding portion includes the second core part, and either no reverse face side insulating layer or reverse face side insulating layers provided on the reverse face side of the second core part so that the number of the reverse face side insulating layers is smaller than the number of the face side insulating resin layers.

In the wiring board according to the invention, one insulating resin layer is provided or a plurality of insulating resin layers are laminated on the principal face side of the first core part, that is, on the principal face side of the core substrate whereas no reverse face side insulating layer is provided or reverse face side insulating layers are provided on the reverse face side of the second core part, that is, on the reverse face side of the core substrate so that the number of the reverse face side insulating layers is smaller than the number of the insulating resin layers. Hence, the wiring board is inexpensive compared with the double-side laminated wiring board because the number of the reverse face side insulating layers can be set to be zero or small.

Figure 1:
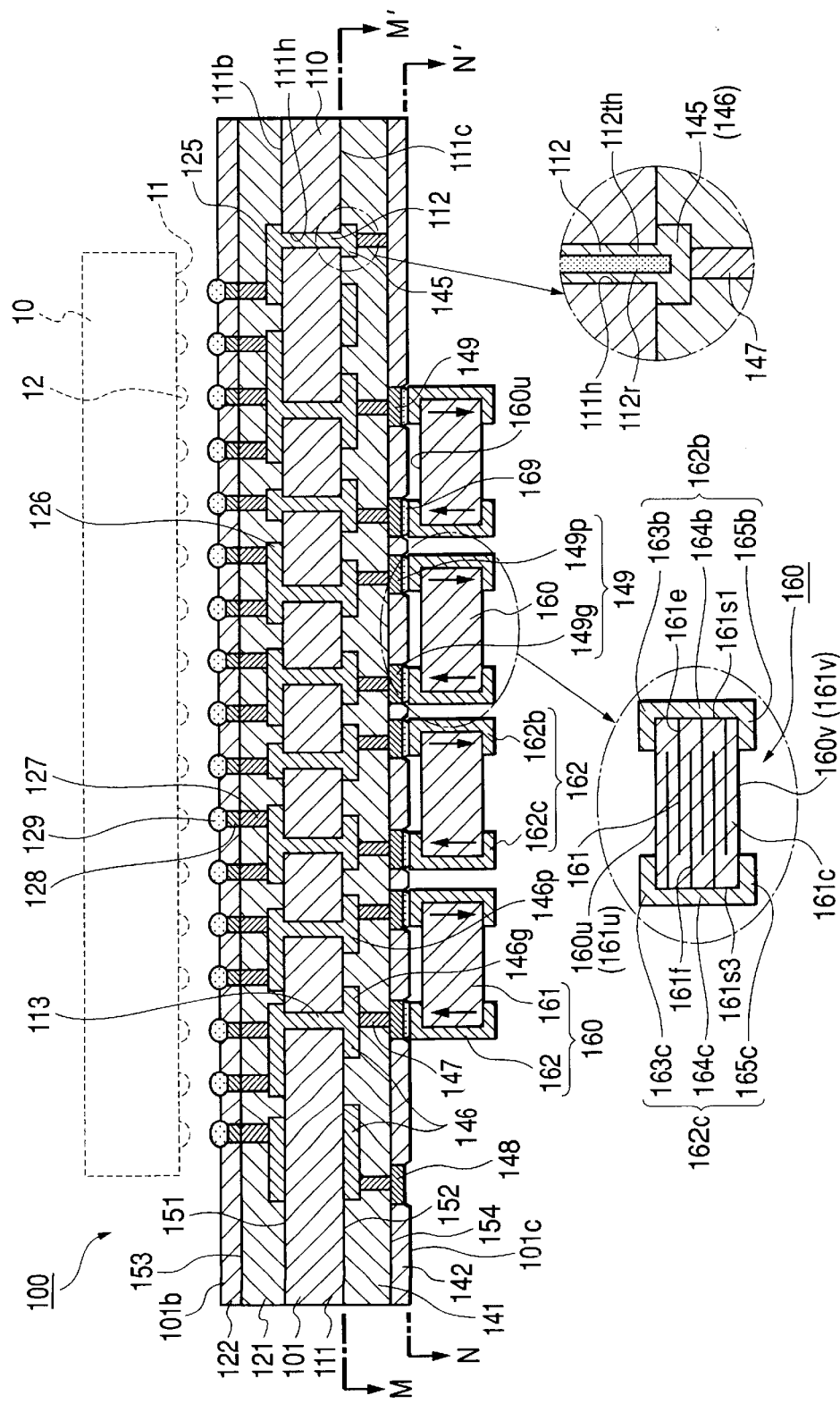
FIG. 1 is a cross sectional view of the wiring board according to the embodiment 1.

[Description of the Reference Numerals and Signs]
100, 800, 900 wiring board
101, 801, 901 wiring board main body 101b, 801b, 901b principal face
101c, 801c, 901c reverse face
110, 810, 960 core substrate
910 first core portion
920 second core portion
111, 811 core substrate main body (insulating layer)
112, 113, 812, 813, 962 through-hole conductor
121, 821, 930 principal face side insulating resin layer (insulating layer)
122, 142, 822, 842, 966, 967 solder resist layer
127, 827 via-conductor
128, 828 pad
129, 829 bump (principal face side connecting terminal)
141 reverse face side insulating resin layer (insulating layer)
841 reverse face side insulating resin layer (most-reverse face side insulating layer)
146, 246, 346, 446, 546, 646, 849, 946 converting-conductor layer
146p, 246p, 346p, 446p, 546p, 646p, 849p, 946p first converting-conductor layer part
146g, 246g, 346g, 446g, 546g, 646g, 849g, 946g second converting-conductor layer part
149p, 949p first capacitor-connecting pad (first capacitor-connecting terminal)
149g, 949g second capacitor-connecting pad (second capacitor-connecting terminal)
152, 952 interlayer (specific interlayer)
151, 153, 154, 851, 852, 853, 854, 951, 953, 954 interlayer
965 cavity
970 cavity surrounding portion
160, 360, 560 chip capacitor
160u, 360u, 560u upper face of chip capacitor (first face)
161, 361, 561 chip capacitor main body
161u, 361u, 561u upper face of chip capacitor main body
161s, 361s side face of chip capacitor main body
161e, 161f electrode layer (electrode)
162, 362 capacitor terminal
163b, 363b upper face part (first terminal)
163c, 363c upper face part (second terminal)
164b, 164c side face part
165b, 165c lower face part
563b terminal (first terminal)
563c terminal (second terminal)
41 current-reverse-flowing part

DETAILED DESCRIPTION OF THE INVENTION (Embodiment 1)

A first embodiment of the invention will be explained, referring to FIGS. 1 to 7. The wiring board 100 shown in FIGS. 1 and 6 comprises a wiring board main body 101 and the chip capacitors 160 mounted on a reverse face 101c. The wiring board 101 has a core substrate 110, a principal face side insulating resin layer 121 made of epoxy resin and a solder resist layer 122 laminated on the upper surface of the core substrate 110, a reverse face side insulating resin layer 141 and a solder resist layer 142 laminated on the lower surface of the core substrate 110. On the center part of the principal face 101b of the wiring board main body 101, lots of bumps 129 are formed, and the lots of bumps 129 can make flip-chip connections with many connecting terminals 12 formed on the under surface 11 of IC chip 10 shown with an imaginary line. On the center part of the reverse face 101c, lots of capacitor connecting pads 149 (the first and the second capacitor connecting pads 149p and 149g) are formed on which many chip capacitors 160 are mounted with solders 169. At the periphery of the reverse face 101c, connecting pads 148 are formed connectable to respective terminals formed on other wiring board such as a mother board (not shown).

The core substrate 110 has a core substrate main body 111 made of a composite material of glass-epoxy resin being a rectangular plate of 31 mm×31 mm×1.0 mm thick. Between an upper surface 111b and a lower surface 111c, many through holes 111h are formed penetrating therethrough. On the interiors of the through holes 111h, known through hole conductors 112, 113 are formed.

The bumps 129 formed on the principal face 101b are connected to wiring layers 125, 126 formed on the upper surface 111b of the core substrate main body 111 (interlayer 151 of the core substrate main body 111 and the principal face side insulating resin layer 121) via pads 128 opening to the solder resist layer 122 and the via-conductors 127 penetrating the principal face side insulating resin layer 121.

Specifically, the bumps 129 positioned almost on the peripheral part are connected to the wiring layers 125 through pads 128 and the via-conductors 127. The wiring layers 125 fan out toward the peripheral side (the right or left directions in FIGS. 1 and 6), connect with the through hole conductors 112 positioned on the peripheral part and further connect with the connecting pads 148 exposed from the solder resist layer 142 via the wiring layers 145 formed in the reverse face 111c (the interlayer 152 between the core substrate main body 111 and the reverse face side insulating resin layer 141) and the via-conductors 147. These members are mainly served as wiring for signals, and sometimes served as source wiring for supplying +source potential and earth potential.

For reducing resistance and inductance occurring in the via-conductors 147, the reverse face side insulating resin layer 141 and the connecting pads 148 are preferably connected via a plurality of via-conductors 147.

On the other hand, the bumps 129 positioned almost on the center are connected to the wiring layers 126 formed at the interlayer 151, which do not fan out, but adjust the connecting positions or otherwise join the wiring (the via-conductors) from the plural bumps 129, that is, connect in parallel them, and connect with the through hole conductors 113 positioning at the center. In comparison with the distance between the bumps 129 (for example, minimum 150 μm), the distance between the through hole conductors 113 (for example, minimum 600 μm) is preferably larger.

Further, the bumps 129 are connected to the converting-conductor layers 146 formed at the lower plane 111c (the interlayer 152) of the core substrate 111 and connected to capacitor-connecting pads 149 exposed from the solder resist layer 142 via the via-conductors 147 passing the reverse face side insulating resin layer 141. Accordingly, electrodes 162 (162b, 162c) of the capacitors 160 and the bumps 129 are connected.

As seen at the left side of FIG. 1, some of the connecting pads 148 positioning on the periphery of the reverse face 101c pass the via-conductors 147 and connect with the converting-conductor layers 146, and through such courses, the +source potential and earth potential are supplied respectively into the bumps 129 and the chip capacitors 160 at the center part. Otherwise, through the course of the connecting pad 148, the via-conductor 147, the wiring layer 145, the through hole conductor 112, and the wiring layers 125, 126, the +source potential and the earth potential can be also supplied respectively into the bumps 129 and the chip capacitors 160 at the center part.

The converting-conductor layers 146 are, as later mentioned (refer to FIG. 4), made patterns of the first converting-conductor layers 146p connected to the +source potential (common first potential) and the second converting-conductor layers 146g connected to the earth potential (common second potential).

Figure 2:
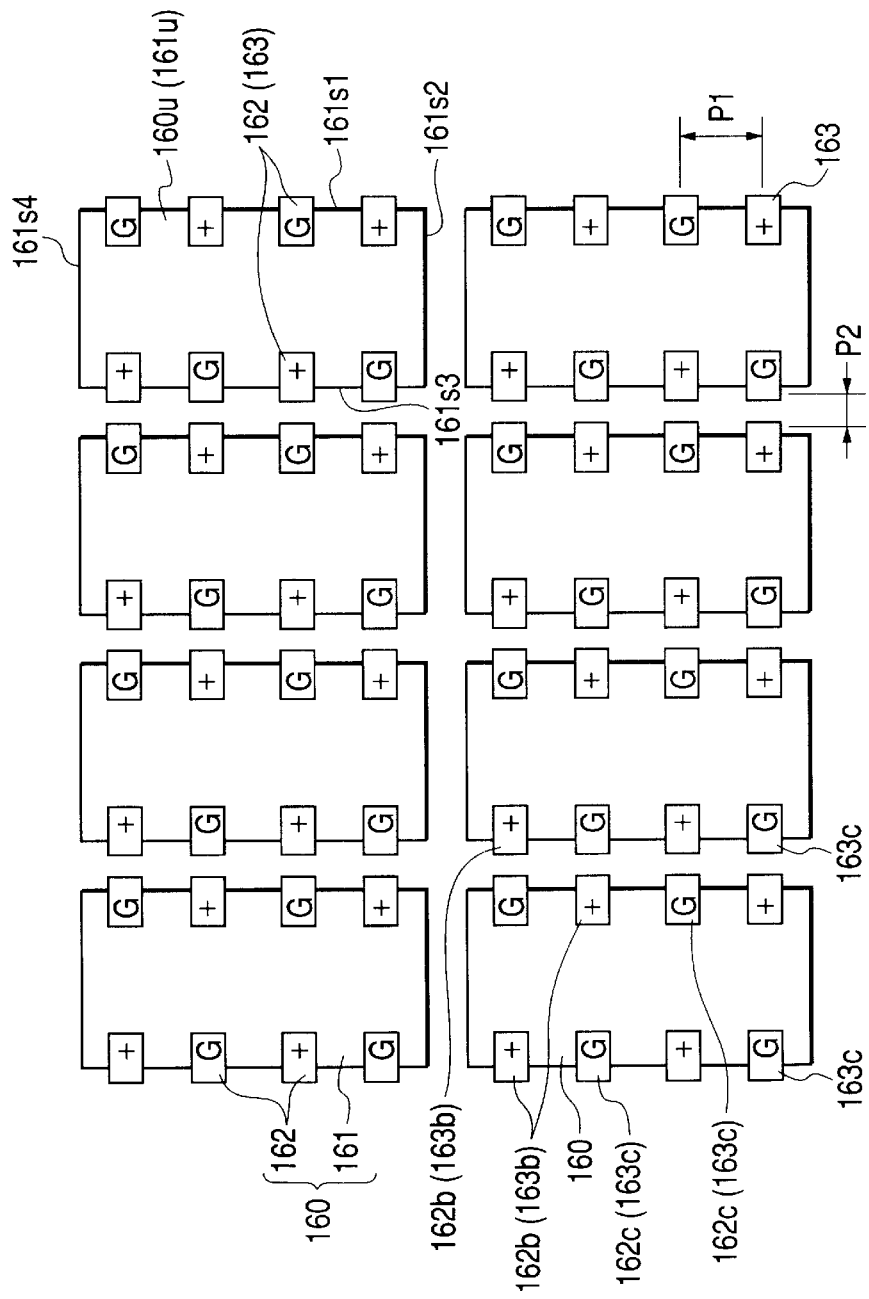
FIG. 2 is an explanatory view showing potentials of the respective terminals of the chip capacitors arranged longitudinally and latitudinally.
Figure 3:
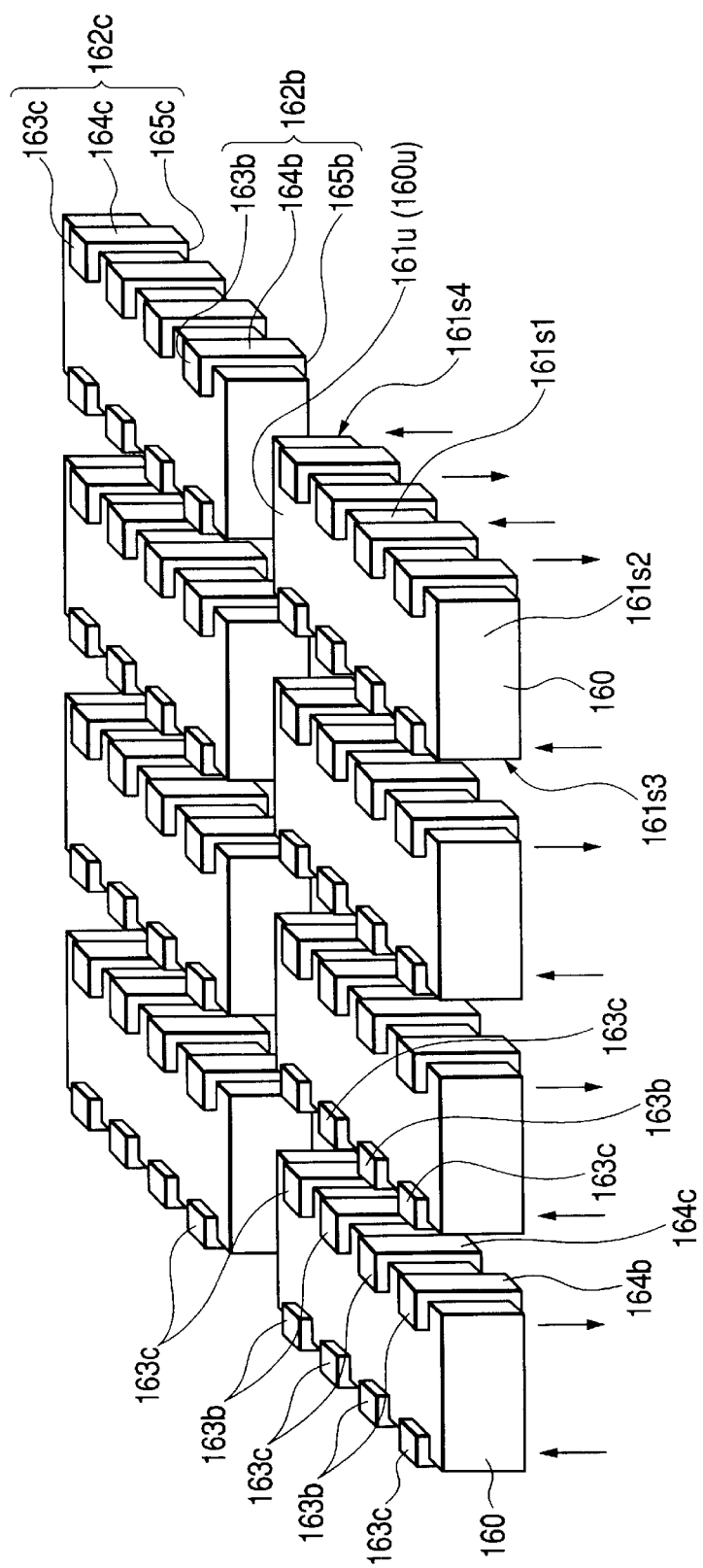
FIG. 3 is an explanatory perspective view showing conditions of the chip capacitors arranged longitudinally and latitudinally and directions of the current flowing along the sides thereof.

The chip capacitors 160 mounted on the reverse face 101c are, as seen in an enlarged view at the lower part of FIG. 1, FIGS. 2 and 3, laminated ceramic capacitors made of BaTiO3 based high dielectric ceramic. Of them, the capacitor main body 161 is substantially rectangular (3.2×1.6×0.8 mm) having an upper face 161u being a capacitor upper face (first face) 160u directing to a main face 101b of the wiring board main body 101, a lower face 161v being a capacitor lower face 160v directing to a lower face 110b, and four side faces 161s (161s 1, 161s 2, 161s 3, 161s 4) (see FIGS. 2 and 3).

As shown in an enlarge view of FIG. 1, at an interior of the chip capacitor 160, one electrode layers 161e and another electrode layers 161f are many and alternately laminated via the ceramic high dielectric layers 161c parallel to the upper face 161u (vertically along the side face 161s), that is, parallel to the main face 191b. These electrode layers 161e, 161f comprise nickel (Ni). Parts of the electrode layers 161e, 161f are drawn to the first side face 161s1 and the third side face 161s3, and connect with the side face 164 of a terminal 162 of Cu. Specifically, one electrode layer 161e connect with one side face 164b, while the other electrode layer 161f connect with the other side face 164c.

Terminals 162b, 162c have side face parts 164b, 164c respectively positioning on a first side 161s1 and a third side 161s3, and have upper face parts 163b, 163c on an upper face 161u and lower face parts 165b, 165c on a lower face 161v. Therefore, the terminals 162b, 162c go over the periphery of the upper face 161u from the upper face parts 163b, 163c, and extend a side face 161s (side faces 164b, 164c) from an upper face 161u (i.e., a side of a main face 101b) toward a lower face 161v (i.e., a side of a reverse face 101c), and go over the periphery of the lower face 161v to connect with the lower faces 165b, 165c, and thus form substantially U shapes.

The chip capacitor 160 of this embodiment is formed with respective terminals 162 at the first side face 161s1 and the opposite third side face 161s3, while at the second side face 161s2 and the fourth side face 161s4, the terminals 162 are not formed. As shown in FIG. 2, in regard to one chip capacitor 160, seeing clockwise from the first side face 161s1, second side face 161s2, third side face 161s3 and fourth side face 161s4, the terminals 162b, 162c, accordingly, the upper face parts 163b, 163c are arranged alternately. In short, as later mentioned, if either one of the electrode layers 161e and 161f (161e in this embodiment) is the +source potential (shown with "+" in FIG. 2) and the other (161f in this embodiment) is earth potential (shown with "G" in FIG. 2), the terminal 162b (the upper face part 163b) connected to the source potential shown with "+" and the terminal 162c (the upper face part 163c) connected to the earth potential shown with "G" are alternately arranged.

As shown in FIGS. 2 and 3, the chip capacitors 160 are arranged in lattice longitudinally and latitudinally such that the first side face 161s1 and the third side face 161s3 of the adjacent chip capacitors 160 as well as the second side face 161s2 and the fourth side face 161s4 of the same are opposite to each other. Therefore, considering the connection of the source potential and the earth potential to the respective chip capacitors 160, as shown in FIG. 2, the mutual side face parts 164 of the adjacent and opposite terminals 162 are other potential, that is, as shown in FIG. 3, the side face part 164b of the source potential of one-side capacitor and the side face part 164c of the earth potential of the other-side capacitor are made adjacent.

Incidentally, if charging and discharging the chip capacitors 160, the current flows along the side face parts 164 of the terminals 162 as shown with arrows in FIGS. 1 and 3. By this current, inductance is created at the side faces 164 extending vertically the side face 161s1. The arrow marks in the same show the current flowing directions when charging. In the case of discharging, the current flowing directions are of course reversed.

Seeing one chip capacitor 160, in the relation of the adjacent side face parts 164, as the potentials to be connected thereto are different, the directions of the current flowing when charging and discharging the chip capacitor are opposite to each other. Thus, if positioning the chip capacitors such that the potentials to be connected to the adjacent side parts 164 are different, the inductance of the side face part 164 (the terminal 162) may be reduced by the amount of the mutual inductance created by connection of both.

Besides, seeing the adjacent two chip capacitors 160, also in the relation between the adjacent and opposite side face parts 164, as the potentials to be connected are different, the directions of the current flowing when charging and discharging the chip capacitor are opposite to each other. Also herein, the self-inductance may be reduced by the amount of the mutual inductance created by connection of both. Accordingly, as a whole, the inductance may be more lowered.

In addition, in this embodiment, as shown in FIG. 2, the distance (pitch), P2=0.4 mm, between the adjacent side face parts 164 of the adjacent chip capacitors 160 is smaller than the distance (pitch), P1=0.8 mm, between the adjacent side face parts 164 in the chip capacitors 160, so that the connection of the adjacent and opposite side face parts 164 is large, thereby enabling to make the inductance smaller.

Clearances are maintained between the mutual chip capacitors 160, and the solder resist layers 142 intervene between the mutual capacitor connecting pads 149, whereby insulation is kept of the mutual side face parts 164.

In the wiring board main body 101 of the embodiment, as shown in FIG. 1, the converting-conductor layers 146 are defined at the interlayer 152 between the core substrate main body 111 and the reverse face side insulating resin layer. Explanation will be made to the converting-conductor layers 146, the terminals 162b, 162c of the chip capacitors 160, in particular, the upper face parts 163b, 163c, and the through hole conductors 113, referring to FIGS. 4, 5 and 6.

Figure 4:
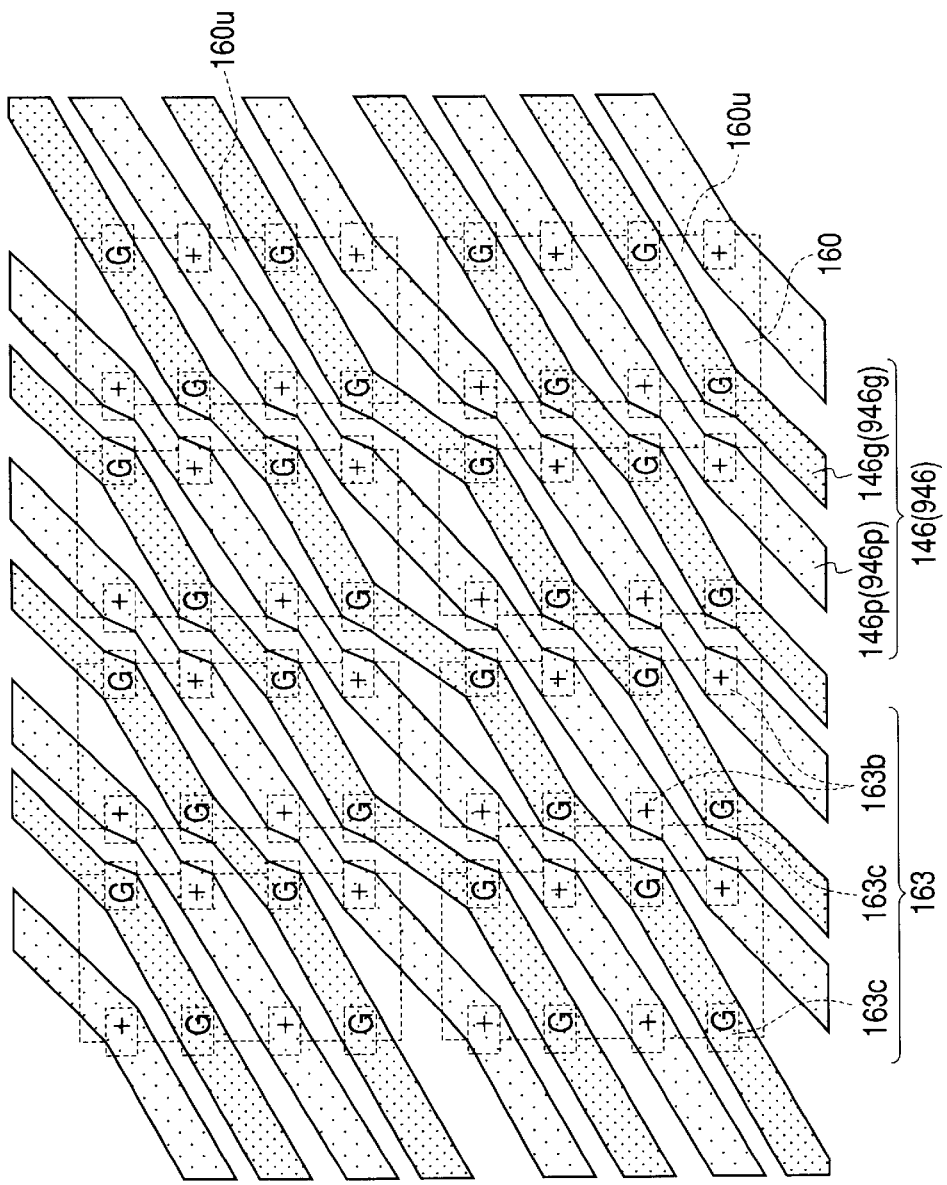
FIG. 4 is an explanatory view showing the relation between the converting-conductor layers and the respective terminals of the chip capacitors.
Figure 6:
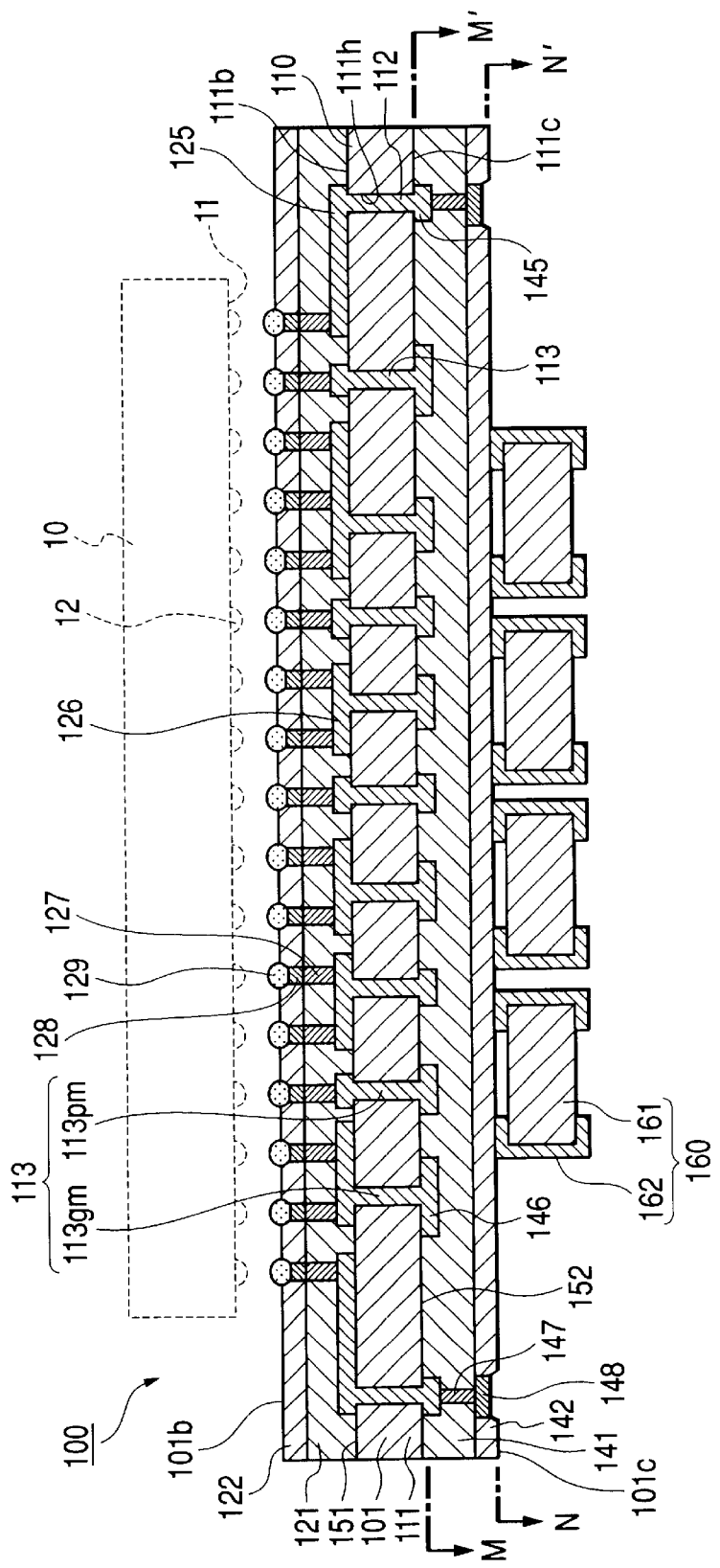
FIG. 6 is another cross sectional view of the wiring board according to the embodiments 1 and 2.

FIG. 4 is a view seeing the chip capacitors 113 in M–M' cross section of FIGS. 1 and 6 by seeing through (or excepting) the reverse face side insulating layers 141, solder resist layer 142 and capacitor connecting terminals 149 from the principal face side, and therefore a view showing, in N–N' cross section in FIG. 1, a condition of projecting the converting-conductor layers 146 onto the upper faces 160u from the principal face. The converting-conductor layers 146 include the first converting-conductor layers 146p and the second converting-conductor layers 146g, and as showing by differing the hatching in FIG. 4, the first converting-conductor layers 146p and the second converting-conductor layers 146g are each band-shaped and arranged alternately in striped pattern.

Besides, the first converting-conductor layers 146p position on the upper side (the principal face 101b side) of the terminals 162b (the upper face part 163b) connected to the +source potential among the terminals 162 (the upper face part 163) of the chip capacitors 160, while the second converting-conductor layers 146g position on the upper side (the principal face 101b side) of the terminals 162c (the upper face part 163c) connected to the earth potential. Accordingly, it is sufficient to connect the first converting-conductor layers 146p with the terminals 162b (the upper face part 163b) of the chip capacitors 160 positioning on the lower side (the reverse face 101c side) through the short via-conductors 147 passing the reverse face side insulating resin layer 141 and the first capacitor connecting pads 149p (see FIG. 1).

Similarly, it is sufficient to connect the second converting-conductor layers 146g with the terminals 162c (the upper face part 163c) positioning on the lower side through the short via-conductors 147 passing the reverse face side insulating resin layer 141 and the second capacitor connecting pads 149g.

Therefore, it is possible to lower the resistance and the inductance occurring between the converting-conductor layers 146 and the terminals 162 (the upper face part 163) of the capacitors 160.

Figure 5:
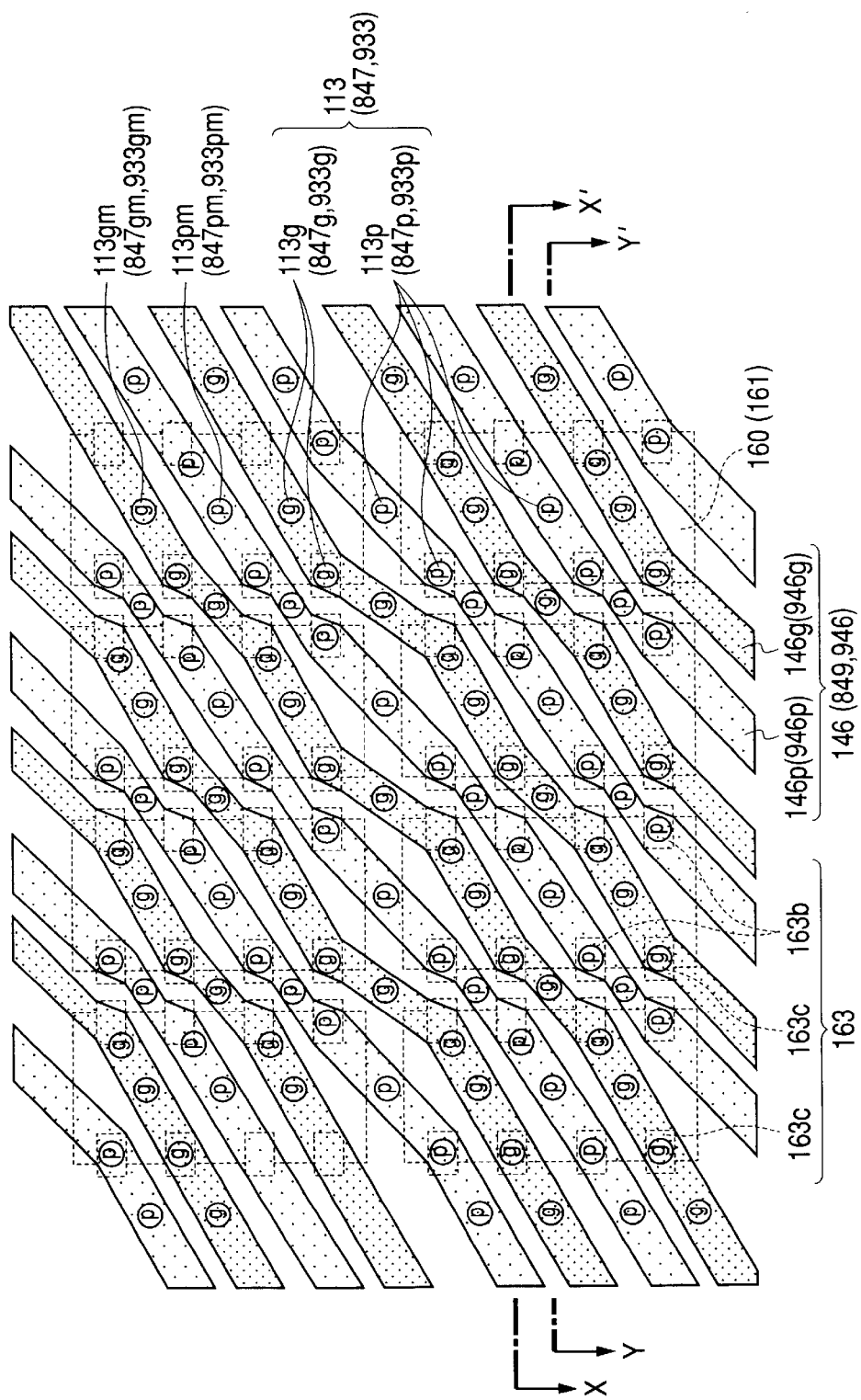
FIG. 5 is an explanatory view showing the relation among the converting-conductor layers, the via-conductors connected to the converting-conductor layers from the principal face side and the respective terminals of the chip capacitors.

Next explanation will be made to the relation of connecting the converting-conductor layers 146 and the through hole conductors 113 positioning to the principal face side than the converting-conductor layers, referring to FIG. 5. FIG. 5 shows that the first and the second converting-conductor layers 146p, 146g disposed in stripe in FIG. 4 are further overlapped with the connecting positions of the through hole conductors 113 connecting from the principal face side. In FIG. 5, the positions of the through hole conductors 113p connected to the first converting-conductor layers 146p are expressed with ◯ and "p", while the positions of the through hole conductors 113g connected to the second converting-conductor layers 146g are expressed with ◯ and "g". As easily comprehending from FIG. 5, in this embodiment, there are some of the through hole conductors 113p, 113g, which respectively connect with the first and second converting-conductor layers 146p, 146g on the upper parts (the principal face 101b side) of the terminals 162b, 162c (the upper face parts 163b, 163c), and there are another some of them, which do not connect thereto on the upper parts of the upper face parts 163b, 163c. The X–X' cross section of FIG. 5 correspond to that of FIG. 1.

A part between the first converting-conductor layers 146p bridging the two terminals 162b (the upper face part 163b) in the chip capacitors 160, specifically, the through hole conductors 113pm connect with the first converting-conductor layers 146p on the center line when seeing the chip capacitors 160 longitudinally in plane. Similarly, a part between the second converting-conductor layers 146g bridging the two terminals 162c (the upper face part 163c) in the chip capacitors 160, specifically, the through hole conductors 113gm connect with the second converting-conductor layers 146g on the center line when seeing the chip capacitors 160 longitudinally in plane. The Y–Y' cross section of FIG. 5 correspond to that of FIG. 1.

As the first converting-conductor layers 146p and the second converting-conductor layers 146g are alternately arranged in stripe, for connecting from the bump 129 via the pad 128, the via-conductor 127, the wiring layer 126 and the through hole conductors 113, to the converting-conductor layers 126, it is sufficient to adjust the position by use of the short wiring layers 126, and the connection is easy. Therefore, through the through hole conductors 113, the wiring layers 126, the via-conductors 127 and the pads 128, each of the +source potential and the earth potential can be easily drawn out to the bumps 129, and can connect with the chip capacitors 160 at short distance.

Since the first and the second converting-conductor layers 146p, 146g are each formed at the interlayer 152 between the core substrate main body 111 and the reverse face side insulating resin layer 141, comparing with a case of using the converting-conductor layers of flat two layers, the number of the necessary interlayer is reduced, so that the insulating resin layer in the wiring board main body 101 can be lessened by the amount of one layer.

Figure 7:
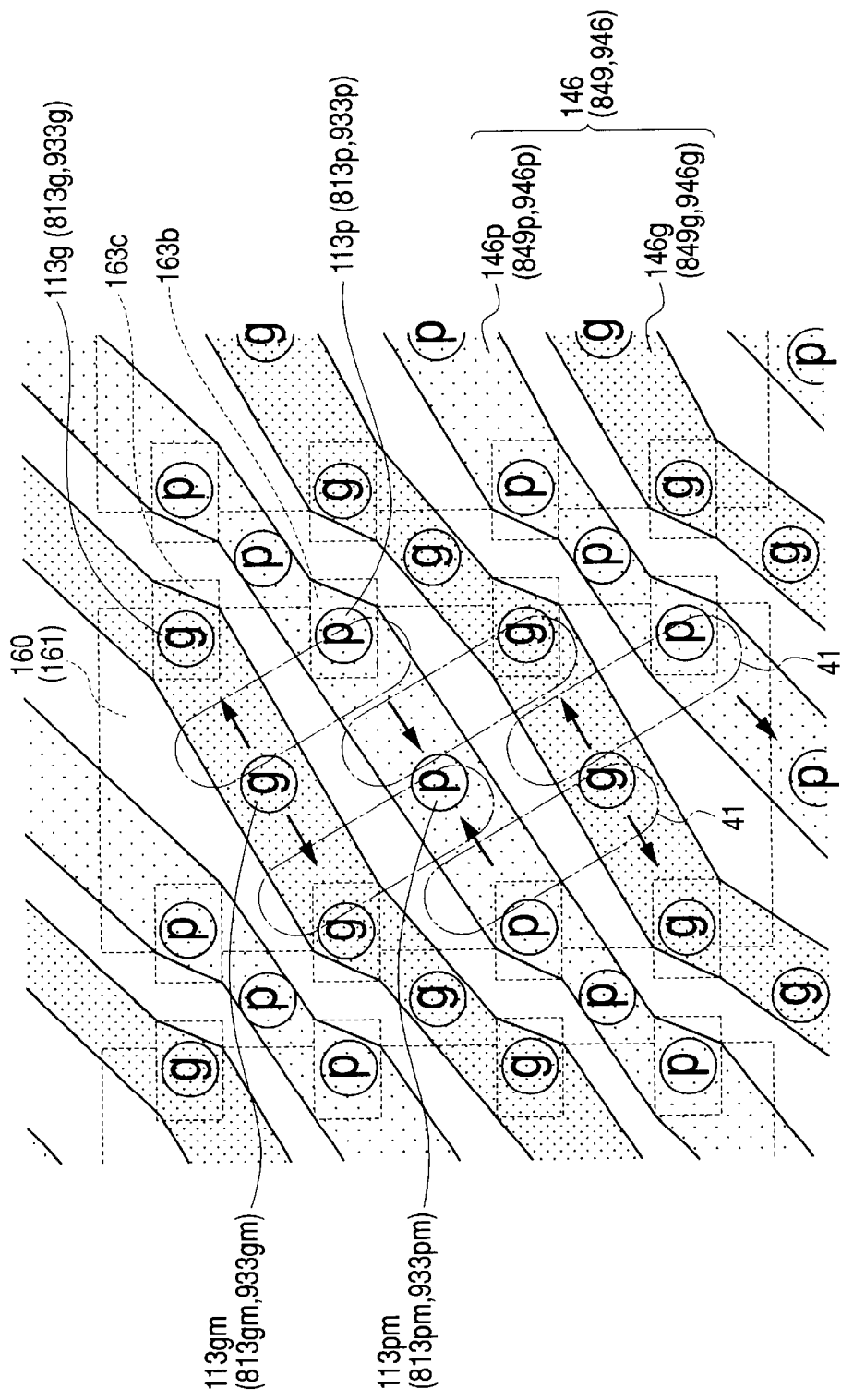
FIG. 7 is an explanatory view showing the mutual relation of the current flowing along the adjacent converting-conductor layers according to the embodiments 1, 2 and 3.

As shown in FIG. 7, a case is considered that the chip capacitors 160 are discharged in the wiring board 100. That is, such a case is considered that the current is caused to flow into IC chip 10 from the terminal 162b (the upper face part 163b) of the source potential of the chip capacitors 160 through the first converting-conductor layers 162p and the through hole conductors 113p, and as a returning path, from IC chip 10, through the through hole conductors 113g and the second converting-conductor layers 146g, the current is caused to flow to the terminal 162c (the upper face part 163c) of the earth potential of the chip capacitors 160. In this case, the arrow marks are given to the current flowing from the first converting-conductor layers 146p into the intermediate connecting through hole conductors 113pm and the current flowing from the intermediate connecting through hole conductors 113pm to the second converting-conductor layers 146g.

In the parts of the revered current encircled with one dotted chain lines in FIG. 7, the direction of the current flowing in the first converting-conductor layers 146p and the direction of the current flowing in the second converting-conductor layers 146g are reversed. Accordingly, it is seen that since the mutual inductances in the parts are negative and can be restrained, the inductance occurring in the whole of the converting-conductor layers 146 and further the wiring board 100 (the wiring board main body 101) can be more lowered.

In this embodiment, as easily understanding from FIGS. 1 and 6, the number of the through hole conductors 113 connected to the converting-conductor layers 146 from the principal face side and the number of the bumps 129 connecting thereto are more than the number of the via-conductors 147 connected to the converting-conductor layers 146 from the reverse face side. Therefore, by furnishing the converting-conductor layers 146 to the interlayer 152, as a whole, resistance and inductance occurring between the chip capacitors 160 and the bumps 129 can be controlled to be lower than a case of furnishing the converting-conductor layers to other interlayer 151.

Further reference will be made to a production method of the wiring board 100 of this embodiment. The embodied wiring board 100 may be formed by a known buildup process of the resin wiring board.

For example, at first, the core substrate main body 111 is prepared which comprises the composite material of glass-epoxy resin and has lots of through holes 111h passing between the upper face 111b and the lower face 111c. The through holes 111h are bored by, e.g., a drill or a laser.

Then, the core substrate main body 111 is carried out with Cu plating by a known panel plating process and formed with predetermined patterns by etching, followed by filling a resin 112r into the through holes 111h. Thus, the through hole conductors 112, 113 are formed in the through holes 111h, and at the same time, the wiring layers 125, 126, 145 of predetermined pattern and the wiring board 146 are formed in the upper face 111b and the lower face 111c of the core substrate main body.

Then, the principal face side and the reverse face side insulating resin layers 121, 141 are formed by the known buildup insulating layer forming technique, and further the via-conductors 127, 147 passing them, the pads 128 and the connecting pads 148 are formed respectively. The solder resist layers 122, 142 are formed to cover unnecessary parts, and the wiring board main body 101 is completed.

Subsequently, the capacitor connecting pads 149 are in advance coated with a solder paste, followed by mounting the chip capacitors 160 on the reverse side and re-flowing thereon to joint the terminals 162 (mainly, the upper face parts 163) of the chip capacitors 160 and the capacitor connecting pads 149 via the solders 169. In addition, the pads 128 are coated with the solder paste and carried out with the re-flowing at temperatures of not fusing the solder 169 for forming the bumps 129. In this manner, the wiring board 100 is completed.

Since the wiring board 100 is mounted with many chip capacitors 160 on the reverse side 101*c*, noises can be exactly removed, and besides the plural chip capacitors 160 are connected in parallel, so that the inductance of the whole mounted capacitors can be decreased. Seeing the respective chip capacitors 160, polarities of the adjacent and opposite terminals are different, and the directions of the currents flowing are reversed. Therefore, the inductance can be more decreased, and it is possible to connect IC chips 10 and the capacitors 160 at lower inductance.

As the terminals 162 of the chip capacitors 160 are formed with the upper face parts 163*b*, 163*c*, the connection is made easy between the capacitor connecting pads 149 formed at the reverse face 101*c*-side of the wiring board main body 101 and the terminals 162 (the upper face parts 163*b*, 163*c*). As the converting-conductor layers, the first converting-conductor layer 146*p* and the converting-conductor layer 146*g* are formed at the same interlayer, so that the number of the insulating resin layers can be decreased. Accordingly, the cost-down can be attained.

(Modified Embodiment 1)

The converting-conductor layers 146 of the above embodiment, as shown in FIG. 4 and others, meander in zigzag, but the first and the second converting-conductor layers 146*p*, 146*g* of almost straight band are alternate to make stripe-patterns, and other stripe-patterns are also enough.

Figure 8:
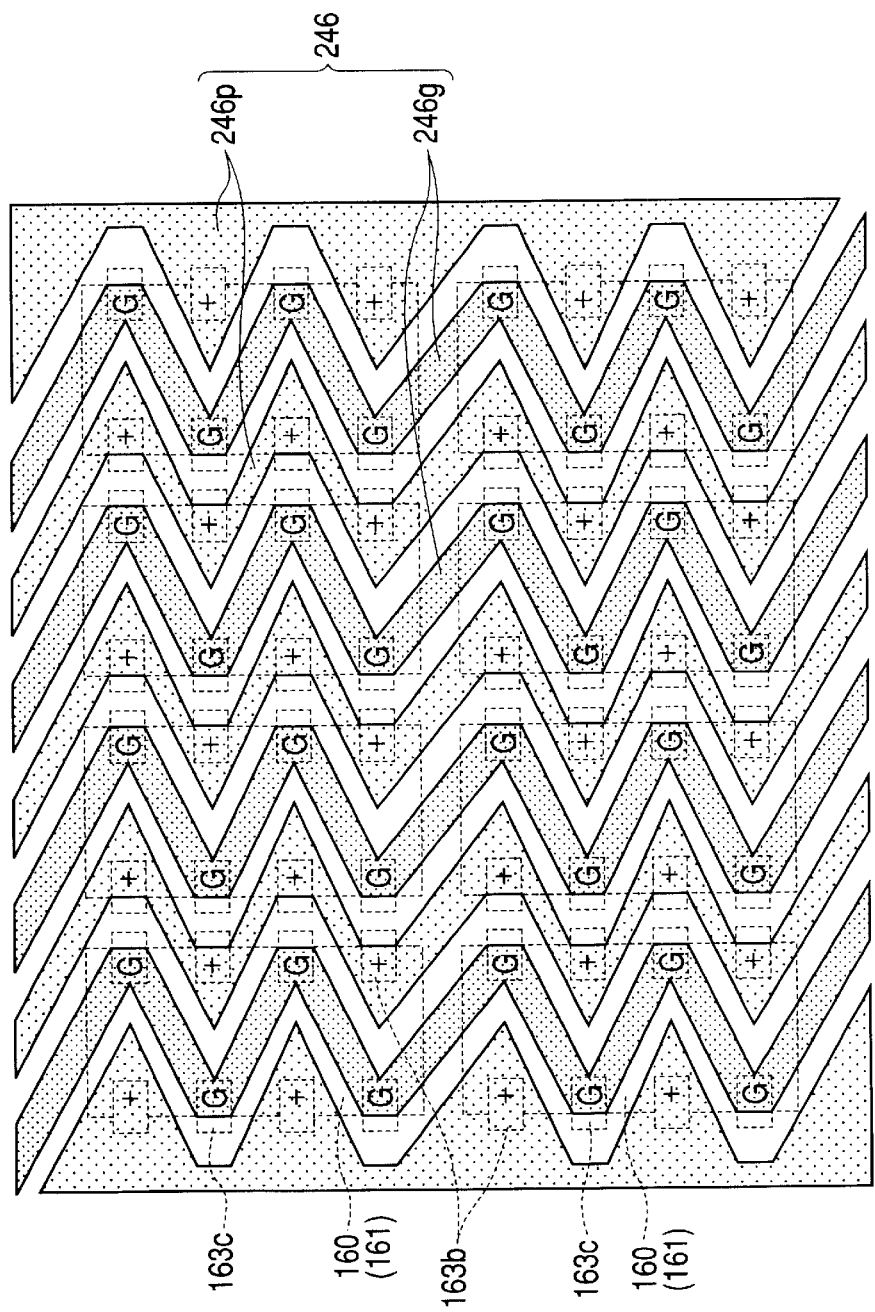
FIG. 8 is an explanatory view showing the relation between the converting-conductor layers and the respective terminals of the chip capacitors in the wiring board according to a modified embodiment 1.

For example, FIG. 8 shows the relation between the first and the second converting-conductor layers 246*p*, 246*g* of this modified embodiment 1 and the upper face parts 163*b*, 163*c* of the terminals 162 of the chip capacitors 160. In this modified embodiment, as easily comprehending from FIG. 8, the first and the second converting-conductor layers 246*p*, 246*g* are made zigzag bands and are alternately arranged in stripe patterns.

The converting-conductor layers 246 are made such patterns, and similarly to the embodiment 1, the upper face parts 163*b*, 163*c* of the chip capacitors 160 are respectively positioned at the lower part (the reverse side) of the first and the second converting-conductor layers 246*p*, 246*g*, and similarly to the embodiment 1, the connection is made by the short via-conductors 147 and the capacitor connecting pads 149. Also in the principal face side of the converting-conductor layer 246, the connection can be easily made with the through hole conductor 113 (see FIG. 1).

Therefore, depending on the converting-conductor layer 246, the chip capacitor 160 and the bump 129 (the connecting terminal 12 of IC chip 10) are easily connected.

(Modified Embodiment 2)

In the above embodiment and the modified embodiment 1, among the four side faces 161*s*1 to 161*s*4 of the chip capacitors 160, the first side face 161*s*1 and the third side face 161*s*3 are formed with terminals 162, and other modified chip capacitors may be employed.

Figure 9:
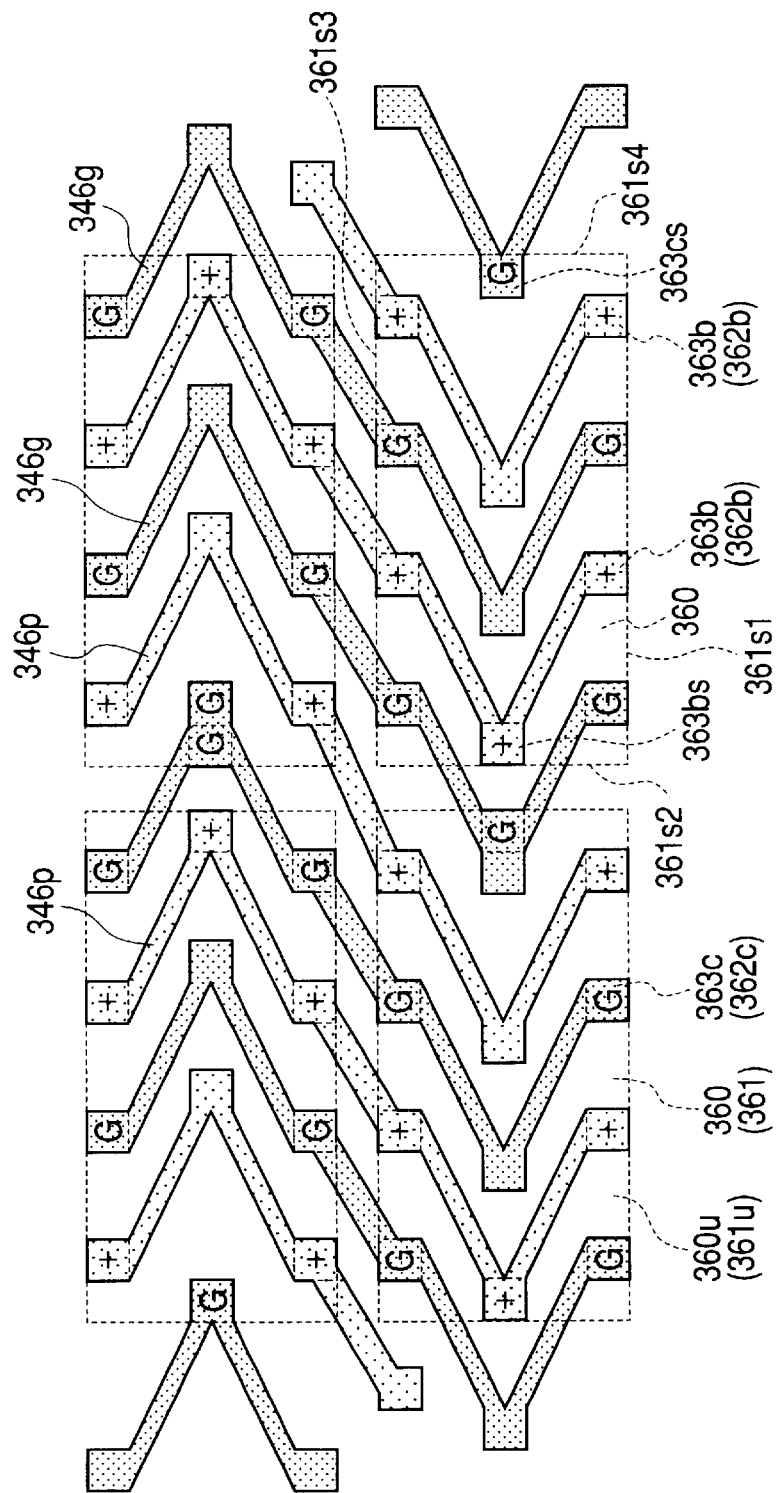
FIG. 9 is an explanatory view showing the relation between the converting-conductor layers and the respective terminals of the chip capacitors in the wiring board according to a modified embodiment 2.

For example, as shown in FIG. 9, the chip capacitor 360 used in the present modified embodiment 2 is, similarly to the chip capacitor 160 of the embodiment 1, formed with terminals 362*b*, 362*c* (the upper face parts 363*b*, 363*c*) in the first side face 361*s*1 and the third side face 361*s*3, and with terminals 362 (the upper face parts 363*bs*, 363*cs*) in the second side face 361*s*2 and the fourth side face 361*s*4.

When using such chip capacitors 360, as shown in FIG. 9, the first and the second converting-conductor layers 346*p*, 346*g* are alternately arranged in zigzag like stripes, so that the respective upper face parts 363*b*, 363*c* (including 363*bs*, 363*cs*) can be positioned at the lower parts of the first and the second converting-conductor layers 346*p*, 346*g*, and similarly to the embodiment 1, both can be connected with the short via-conductors 147. Also in the principal face side of the converting-conductor layer 346, the connection can be easily made with the through hole conductor 113 (see FIG. 1).

Therefore, depending on the converting-conductor layer 346, the chip capacitor 360 and the bump 129 (the connecting terminal 12 of IC chip 10) are easily connected.

(Modified Embodiment 3)

Further, using the chip capacitors 360 in the above modified embodiment 2, the first and the second converting-conductor layers can be made other striped patterns.

Figure 10:
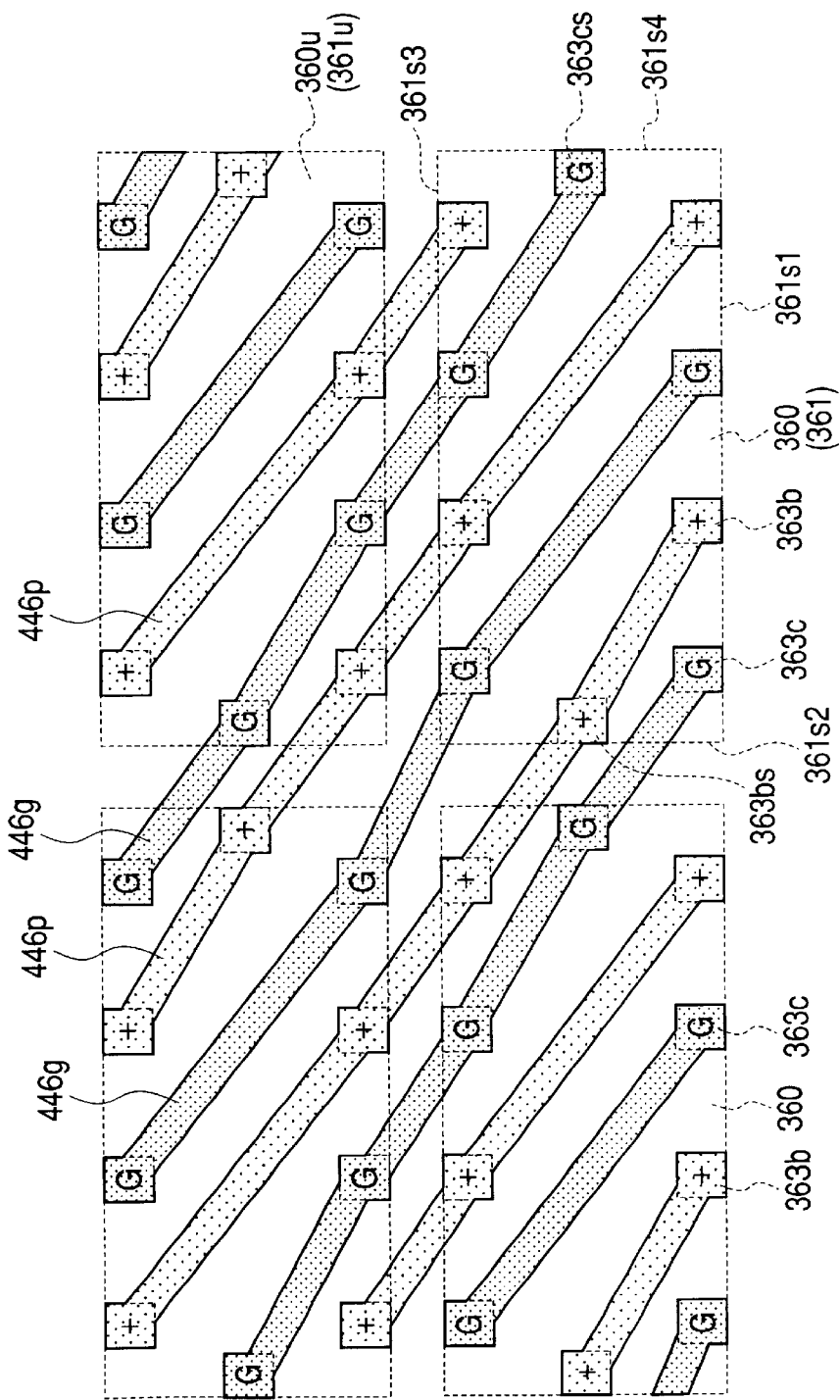
FIG. 10 is an explanatory view showing the relation between the converting-conductor layers and the respective terminals of the chip capacitors in the wiring board according to a modified embodiment 3.

For example, FIG. 10 shows the relation between the first and the second converting-conductor layers 446*p*, 446*g* of this modified embodiment 3 and the upper face parts 363*b*, 363*c* of the terminals 362 of the chip capacitors 360. In this modified embodiment 3, as easily comprehending from FIG. 10, the first and the second converting-conductor layers 446*p*, 446*g* are almost straight and are alternately arranged in stripe patterns. Similarly to the modified embodiment 2, the upper face parts 363*b*, 363*c* are positioned at the lower parts of the first and the second converting-conductor layers 446*p*, 446*g*, and similarly to the embodiment 2, both can be connected with the short via-conductors 147. Also in the principal face side of the converting-conductor layer 446, the connection can be easily made with the through hole conductor 113 (see FIG. 1).

Therefore, depending on the converting-conductor layer 446, the chip capacitor 360 and the bump 129 (the connecting terminal 12 of IC chip 10) are easily connected.

(Modified Embodiment 4)

In the embodiment and the modified embodiments 1 to 3, the terminals 162, 362 of the chip capacitors are formed at the side faces, having the upper face parts 163, 363 going around to the upper parts. But the chip capacitor usable in the invention is enough with such embodiments that the terminal is formed on the upper face of the chip capacitor and can be connected at the upper part (the principal face side) or the terminal is formed in bump.

Figure 11:
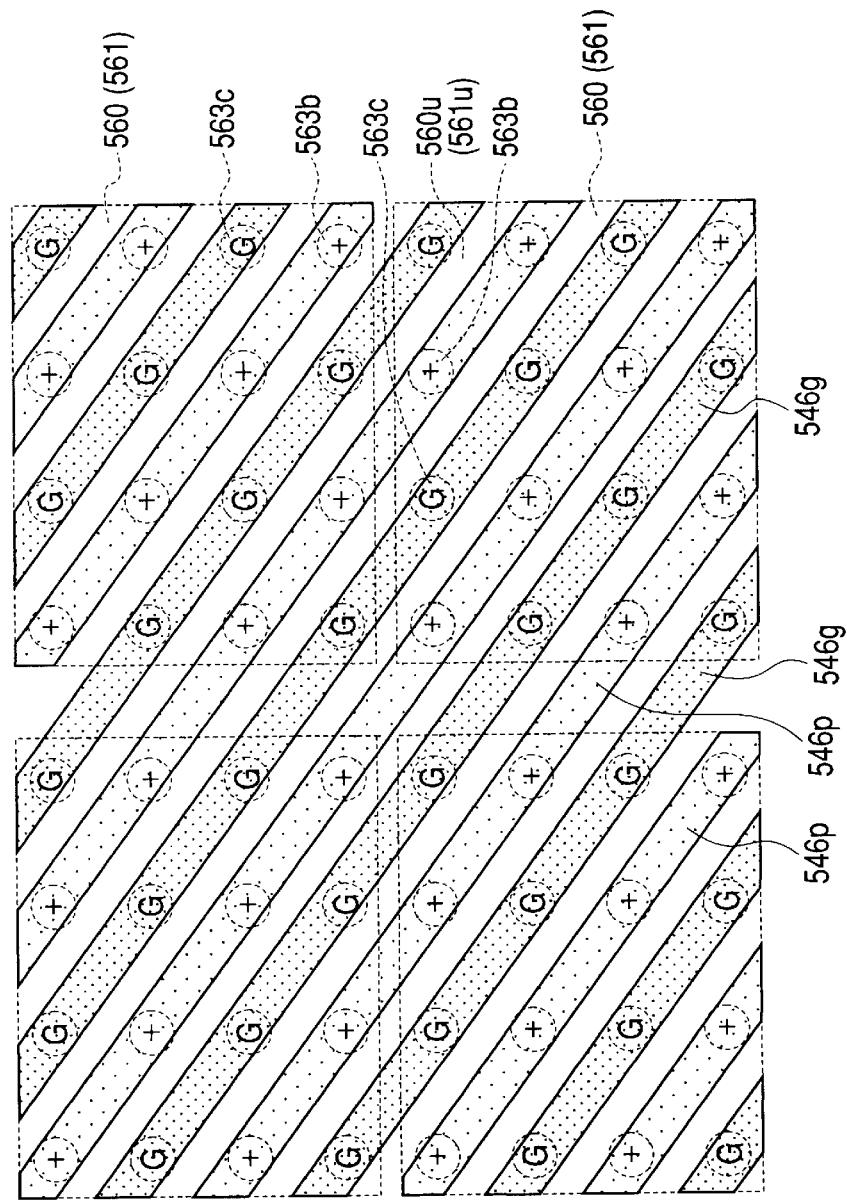
FIG. 11 is an explanatory view showing the relation between the converting-conductor layers and the respective terminals of the chip capacitors in the wiring board according to a modified embodiment 4.

For example, as shown in FIG. 11, being different from the chip capacitor 160 of the embodiment, the chip capacitors 560 used in the modified embodiment 4 have the terminals 563 arranged in lattice longitudinally and latitudinally on the upper face 560*u* (the upper face 561*u* of the chip capacitor main body). Besides, the first terminals 563*b* connected to the +source potential and the second terminals 563*c* connected to the earth potential are alternately placed. When using such chip capacitors 560, as shown in FIG. 11, the first and the second converting-conductor layers in straight band-like arrangement are alternately located to form stripe, so that the respective terminals 563*b*, 563*c* can be positioned under the first and the second converting-conductor layers 546*p*, 546*g*, and similarly to the embodiment 1, the connection is made by the short via-conductors 147 and the capacitor connecting pads 149. Also in the principal face side of the converting-conductor layer 546, the connection can be easily made with the through hole conductor 113 (see FIG. 1).

Therefore, depending on the converting-conductor layer 546, the chip capacitor 560 and the bump 129 (the connecting terminal 12 of IC chip 10) are easily connected.
(Modified Embodiment 5)

Further, using the chip capacitors 560 in the above modified embodiment 4, the first and the second converting-conductor layers can be made other striped patterns.

Figure 12:
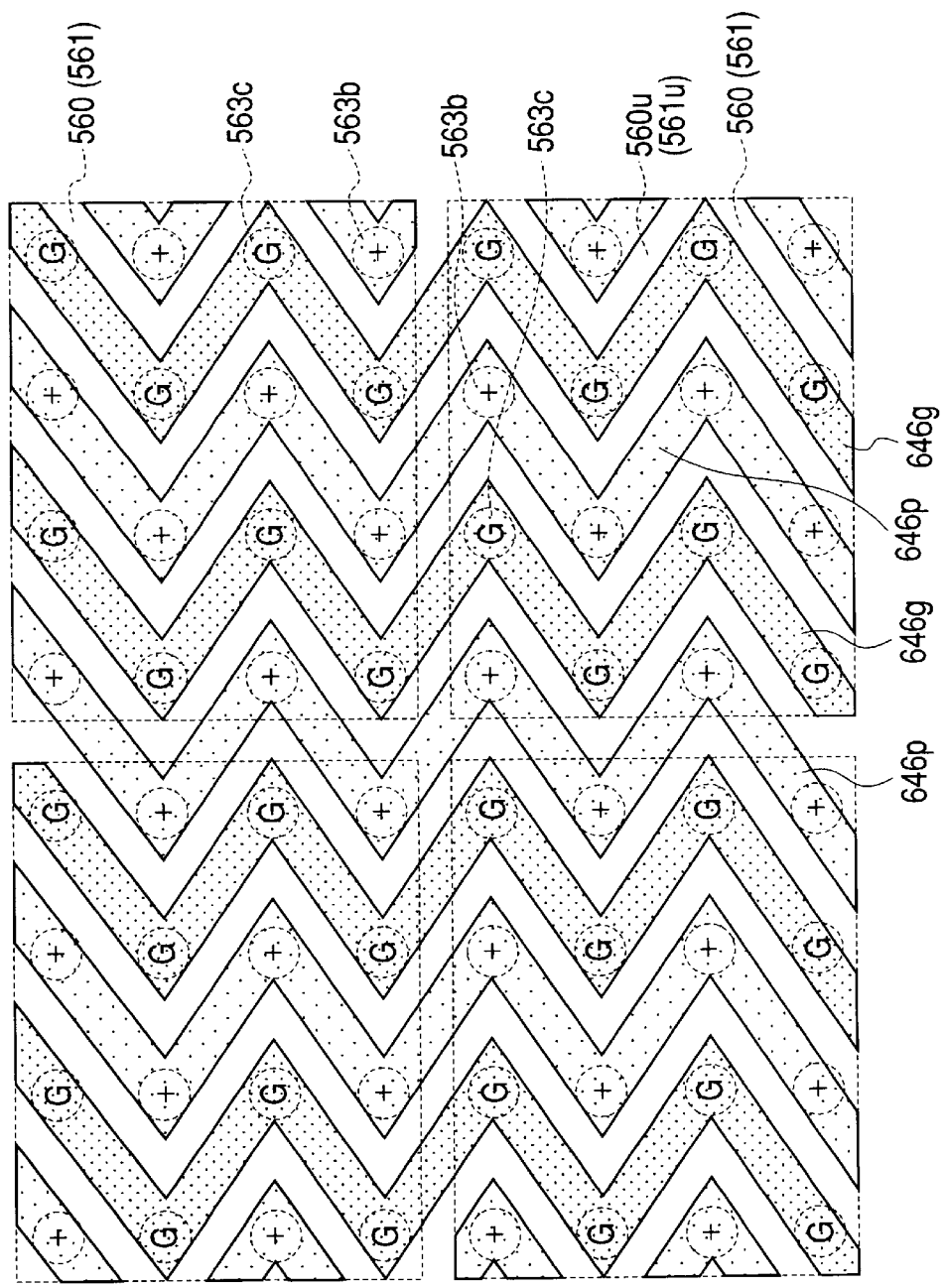
FIG. 12 is an explanatory view showing the relation between the converting-conductor layers and the respective terminals of the chip capacitors in the wiring board according to a modified embodiment 5.

For example, FIG. 12 shows the relation between the first and the second converting-conductor layers 646p, 646g of this modified embodiment 4 and the terminals 563b, 563c of the chip capacitors 560. In this modified embodiment 5, as easily comprehending from FIG. 12, the first and the second converting-conductor layers 646p, 646g are zigzag-band shaped and are alternately arranged in stripe patterns. Further, similarly to the modified embodiment 4, the respective terminals 563b, 563c are positioned under the first and the second converting-conductor layers 646p, 646g. Similarly to the modified embodiment 4, the connection is made by the short via-conductors 147 and the capacitor connecting pads 149. Also in the principal face side of the converting-conductor layer 646, the connection can be easily made with the through hole conductor 113 (see FIG. 1).

Therefore, also depending on the converting-conductor layer 646, the chip capacitor 560 and the bump 129 (the connecting terminal 12 of IC chip 10) are easily connected.
(Embodiment 2)

Explanation will be made to a second embodiment of the invention, referring to FIGS. 13 to 15. A wiring board 800 of this embodiment has substantially the same structure as the wiring board 100. But in the wiring board 100 of the embodiment 1, the converting-conductor layers 146 (the first and the second converting-conductor layers 146p, 146g) of stripe pattern are defined with the interlayer 152 between the core substrate main body 111 and the reverse face side insulating resin layer 141. On the other hand, this embodiment 2 is different in that the converting-conductor layers 849 (the first and the second converting-conductor layers 849p, 849g) of almost the same shape as that of the converting-conductor layer 146 are formed in the reverse side 841c of the reverse face side insulating resin layer 841, that is, at the interlayer 854 between the reverse face side insulating resin layer 841 and the solder resist layer 842. Therefore, different parts will be mainly explained by omitting or simplifying the similar parts.

Figure 13:
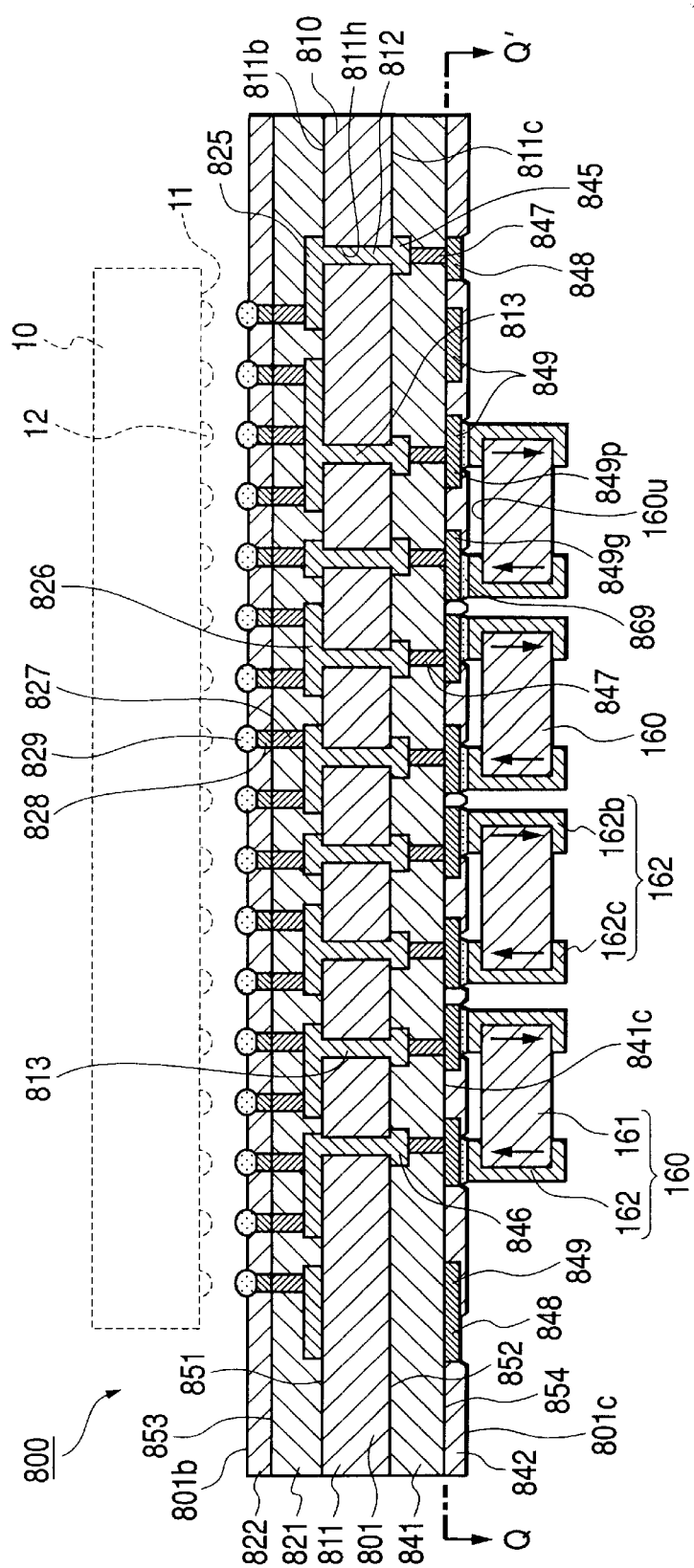
FIG. 13 is a cross sectional view of the wiring board according to the embodiment 2.
Figure 14:
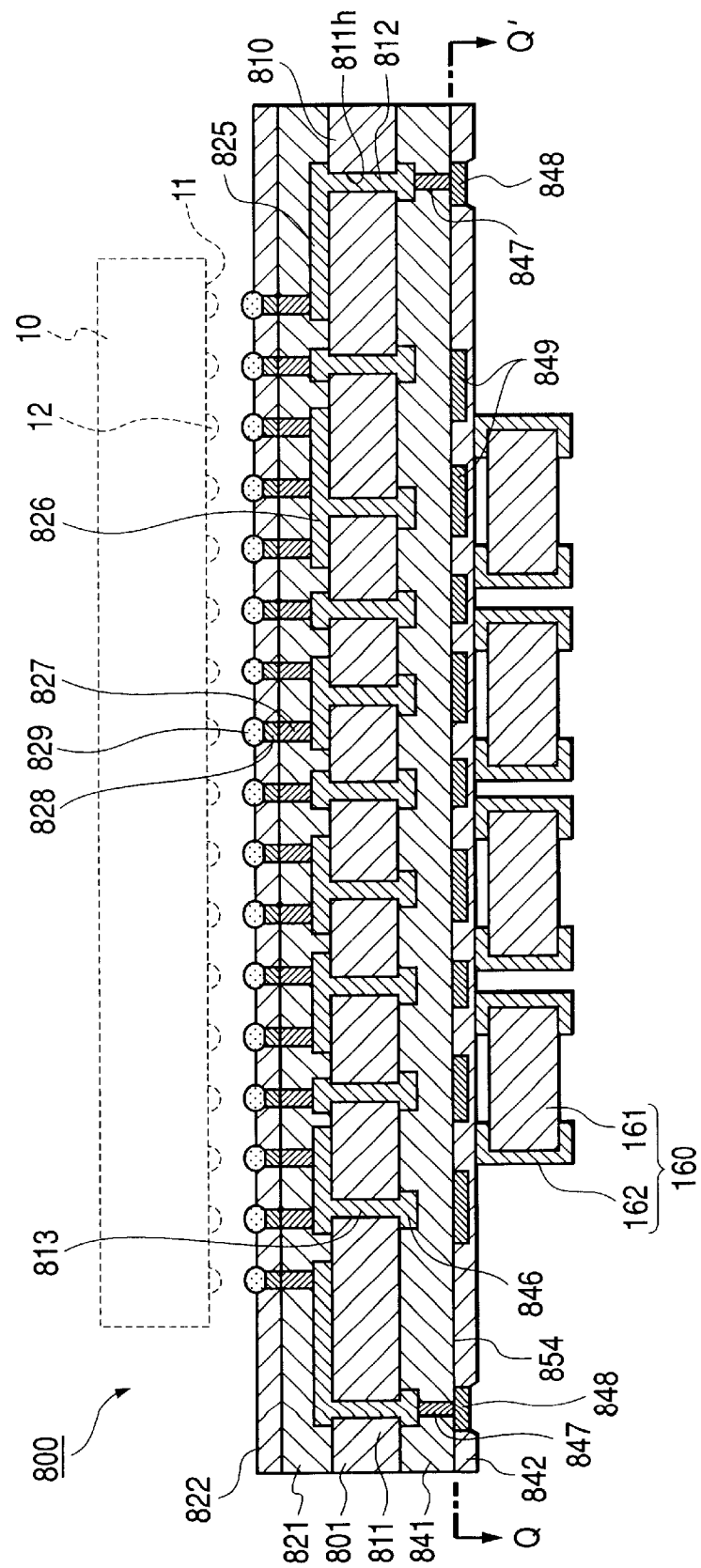
FIG. 14 is another cross sectional view of the wiring board according to the embodiment 2.

The wiring board 800 shown in FIGS. 13 and 14 comprises a wiring board main body 801 and the chip capacitors 160 mounted on a reverse face 801c and similar to that of the embodiment 1. The wiring board 801 has, similarly to the embodiment 1, a core substrate 810, a principal face side insulating resin layer 821 and a solder resist layer 822 laminated on the upper and lower surfaces thereof, a reverse face side insulating resin layer 841 and a solder resist layer 842. On the center part of the principal face 801b of the wiring board main body 801, lots of bumps 829 are formed and make flip-chip connections with many connecting terminals 12 formed on the under surface 11 of IC chip 10 shown with an imaginary line. On the center part of the reverse face 801c, lots of capacitor connecting pads 849 are formed on which many chip capacitors 160 are mounted with solders 869. At the periphery of the reverse face 801c, connecting pads 848 are formed.

The core substrate 810 has a core substrate main body 811 similarly to the embodiment 1. Between an upper surface 811b and a lower surface 811c, many through holes 811h are formed penetrating therethrough. Known through hole conductors 112, 113 are formed at the interior thereof.

The bumps 829 are connected to wiring layers 825, 826 formed on the upper surface 811b of the core substrate main body 111 (the interlayer 851 of the core substrate main body 811 and the principal face side insulating resin layer 821) via the pads 828 opening to the solder resist layer 822 and the via-conductors 827 penetrating the principal face side insulating resin layer 821.

Specifically, the bumps 829 positioned almost on the peripheral part connect with the wiring layers 825 through pads 828 and the via-conductors 827, respectively fan out toward the peripheral side (the right or left directions in FIGS. 13 and 14), connect with the through hole conductors 812 positioned on the peripheral part and further connect with the connecting pads 848 exposed from the solder resist layer 842 via the wiring layers 845 formed in the reverse face 811c (the interlayer 852) and the via-conductors 847. These members are mainly served as wiring for signals, and sometimes served as source wiring for supplying the +source potential and the earth potential.

On the other hand, the bumps 829 positioned almost on the center are connected to the wiring layers 826 formed at the interlayer 851, which do not fan out, but adjust the connecting positions or otherwise join the wiring (the via-conductors) from the plural bumps 829, that is, connect in parallel them, and connect with the through hole conductors 813 positioning at the center. Until here, the conditions are like in the embodiment 1.

Further, the through hole conductors 813 connect with the wiring layer 846 formed on the lower face 811c (the interlayer 852) of the core substrate 811, and connect with the wiring board 849 formed on the reverse face 841c (the interlayer 854) of the reverse face side insulating resin layer 841 through the via-conductors 847 penetrating the reverse face side insulating resin layer 841. Parts of the wiring boards 849 are exposed from the solder resist layers 842, and connect with the terminals 162 (162b, 162c) of the chip capacitors 160 by means of the solder 869. In short, the converting-conductor layers 849 are formed at the reverse face side 841c of the most-reverse face side insulating layer 841 among the insulating layers (the principal face side insulating resin layer 821, the core substrate main body 811 and the reverse face side insulating resin layer 841) intervening between the bumps 829 and the terminals 162 of the chip capacitors 160.

In such a manner, the electrodes 162 (162b, 162c) of the chip capacitors 160 and the bumps 829 are connected.

As seen at the left side of FIG. 13, some of the connecting pads 848 positioning on the periphery of the reverse face 801c connect with the converting-conductor layers 849 at the reverse face 841c of the reverse face side insulating resin layer 841, and through such courses, the +source potential and earth potential are supplied respectively into the bumps 829 and the chip capacitors 160 at the center part. Otherwise, through the course of the connecting pad 848, the via-conductor 847, the wiring layer 845, the through hole conductor 812 and the wiring layers 825, 826, the +source potential and earth potential can be also supplied respectively into the bumps 829 and the chip capacitors 860 at the center part.

Figure 15:
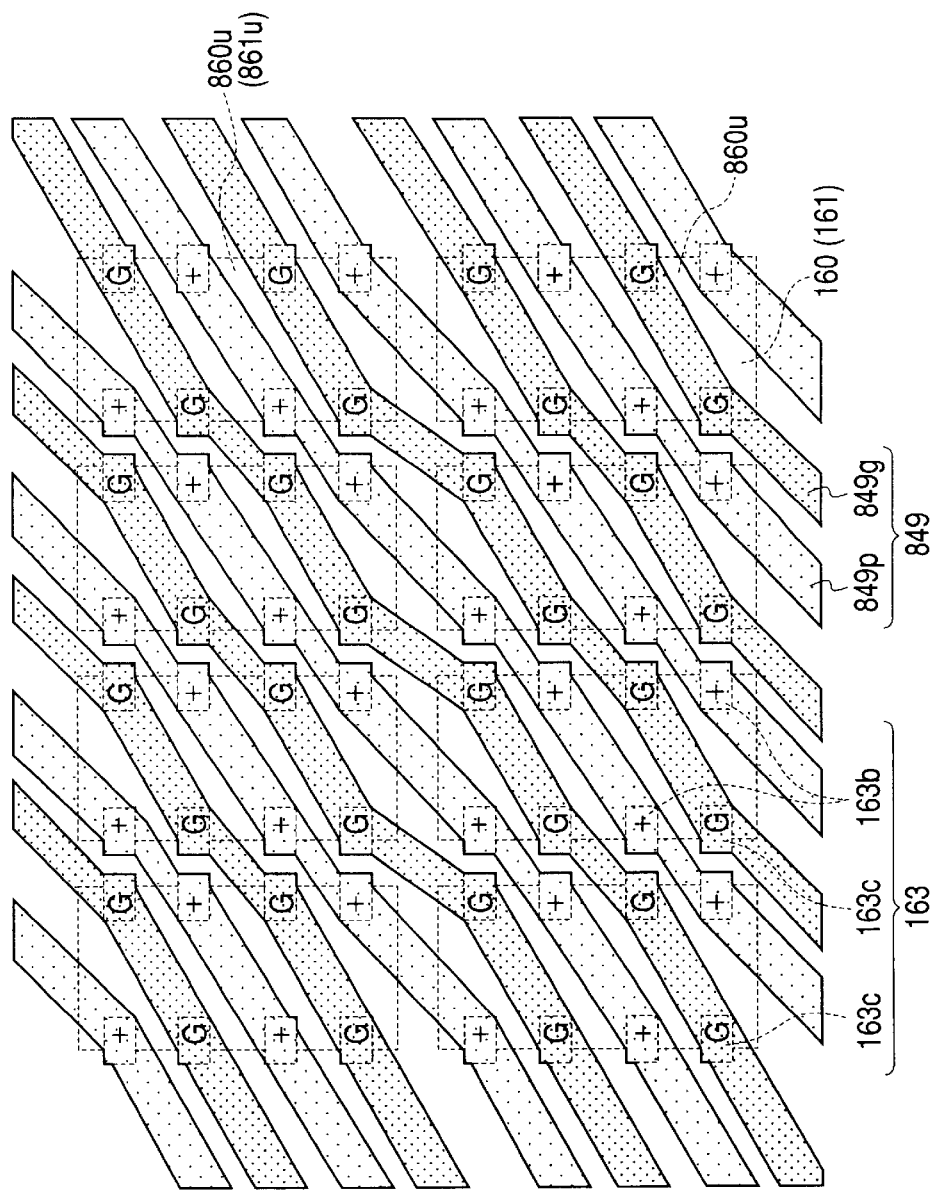
FIG. 15 is an explanatory view showing the relation between the converting-conductor layers and the respective terminals of the chip capacitors according to the embodiment 2.

The converting-conductor layers 849 have, as shown in FIG. 15, almost the same patterns as those of the converting-conductor layers 146 of the embodiment 1, and are made patterns of the first converting-conductor layers 849p connected to the +source potential (common first potential) and the second converting-conductor layers 849g connected to the earth potential (common second potential).

But the converting-conductor layer 849 is different in that triangular projections are formed, in comparison with the converting-conductor layer 146 shown in FIG. 4, for simplifying the connection by coping with the shapes of the terminals 162 (the upper face part 163) of the reverse face side 160. FIG. 15 is a view seeing the chip capacitors 113 in Q–Q' cross section of FIGS. 13 and 14 by seeing through (or excepting) the solder resist layer 842 and the solder 869 from the principal face side, and shows the relation between the converting-conductor layer 849 and the terminals 162b, 162c (the upper face parts 163b, 163c) of the chip capacitor 160.

As easily understanding from FIG. 15, each of the first converting-conductor layers 849p is positioned on the upper side (the principal face 801b-side) of the terminals 162b (the upper face part 163b) connected to the +source potential among of the terminals 162 (the upper face part 163) of the chip capacitors 160, and each of the first converting-conductor layers 849g is positioned on the upper side (the principal face 801b-side) of the terminals 162c (the upper face part 163c) connected to the earth potential. Accordingly, it is possible to easily connect the first converting-conductor layers 849p with the terminals 162b (the upper face part 163b) of the chip capacitors 160 positioning on the lower side (the reverse face 801c-side) by the solder 869 (see FIG. 13).

Similarly, it is possible to easily connect the second converting-conductor layers 849g with the terminals 162c (the upper face part 163c) positioning on the lower side thereof by the solder 869.

Therefore, it is possible to control the resistance and the inductance occurring between the converting-conductor layers 849 and the terminals 162 of the capacitors 160.

The relation of connecting the converting-conductor layers 849 and the via-conductors positioning to the principal face side than the converting-conductor layers, is like the relation between the converting-conductor layer 146 and the through hole conductor 113 in the embodiment 1 explained referring to FIG. 5. That is, as easily comprehending from FIG. 5, also in this embodiment, there are some of the via-conductors 847p, 847g, which respectively connect with the first and second converting-conductor layers 146p, 146g on the upper parts (the principal face 101b side) of the terminals 862b, 862c (the upper face parts 863b, 863c), and there are some of them, which do not connect thereto on the upper parts of the upper face parts 863b, 863c. The X–X' cross section of FIG. 5 correspond to that of FIG. 13. FIG. 5 shows the embodiment of the converting-conductor layer 146 of the embodiment 1 as the shape of the converting-conductor layer, which is somewhat different from the embodiment of the converting-conductor layer 146 shown in FIG. 15.

A part between the first converting-conductor layers 849p bridging the two terminals 162b (the upper face part 163b) in the chip capacitors 160, specifically, the intermediate connecting via-conductors 847pm connect with the first converting-conductor layers 849p on the center line when seeing the chip capacitors 160 longitudinally in plane. Similarly, a part between the second converting-conductor layers 849g bridging the two terminals 162c (the upper face part 163c) in the chip capacitors 160, specifically, the intermediate connecting via-conductors 847gm connect with the second converting-conductor layers 849g on the center line when seeing the chip capacitors 160 longitudinally in plane (see FIG. 5).

As the first converting-conductor layers 849p and the second converting-conductor layers 849g are alternately arranged in stripe, for connecting from the bump 129, via the pad 828, the via-conductor 827, the wiring layer 826, the through hole conductors 813, the wiring layer 846 and the via-conductor 847, to the converting-conductor layers 849, it is sufficient to adjust the position by use of the short wiring layers 826, and the connection is easy. Therefore, through them, each of the +source potential and the earth potential can be easily drawn out to the bumps 829, and can connect with the chip capacitors 160 at short distance.

Since the first and the second converting-conductor layers 849p, 849g are each formed at the reverse face side 841c of the reverse face side insulating resin layer 841, and comparing with a case of using the converting-conductor layers of flat two layers, the number of the necessary interlayer is reduced, so that the insulating resin layer in the wiring board main body 801 can be lessened by the amount of one layer.

As shown in the wiring board 800, the same explanation in the embodiment 1 with reference to FIG. 7 is also applied to the current flowing in the converting-conductor layer 849 when charging and discharging the chip capacitor 160. That is, the case is considered that the chip capacitors 160 are discharged in the wiring board 800. In the parts of the revered current encircled with one dotted chain lines in FIG. 7, the direction of the current flowing in the first converting-conductor layers 849p and the direction of the current flowing in the second converting-conductor layers 146g are reversed. Accordingly, it is seen that since the mutual inductances in the parts are negative and can be restrained, the inductance occurring in the whole of the converting-conductor layers 849 and further the wiring board 800 (the wiring board main body 801) can be more lowered.

In this embodiment, as easily understanding from FIGS. 13 and 14, the number of the via-conductors 847 connected to the converting-conductor layers 849 from the principal face side and the number of the bumps 129 connecting thereto are more than the number of the terminals of the chip capacitors 160 connected to the converting-conductor layers 849 from the reverse face side. Therefore, by furnishing the converting-conductor layers 849 to the reverse face of the reverse face side insulating layer 841 nearest to the chip capacitor 160, in comparison with cases of furnishing the converting-conductor layers to the interlayer 151 or 152, resistance and inductance occurring particularly between the chip capacitors 160 and the bumps 129 can be controlled to be lower.

By the way, the production method of the wiring board 800 of the embodiment 2 may depend on the known buildup process similarly to the wiring board 100 of the embodiment 1, and so explanation will be omitted.

Since the wiring board 800 is also mounted with many chip capacitors 160 on the reverse side 801c, noises can be exactly removed, and besides the plural chip capacitors 160 are connected in parallel, so that the inductance of the whole mounted capacitors can be decreased. Seeing the respective chip capacitors 160, polarities of the adjacent and opposite terminals are different, and the directions of the currents flowing are reversed. Therefore, the inductance can be more decreased, and it is possible to connect IC chips 10 and the capacitors 160 at lower inductance.

As the terminals 162 of the chip capacitors 160 are formed with the upper face parts 163b, 163c, the connection is made easy between the converting-conductor layer 849 and the terminals 162 (the upper face parts 163b, 163c). As the converting-conductor layers, the first converting-conductor layer 849p and the second converting-conductor layer 849g are formed at the reverse face 841c (the interlayer 852) of the same reverse face side insulating resin layer 841, so that the number of the insulating resin layers can be decreased. Accordingly, the cost-down can be attained.

(Embodiment 3)

Figure 16:
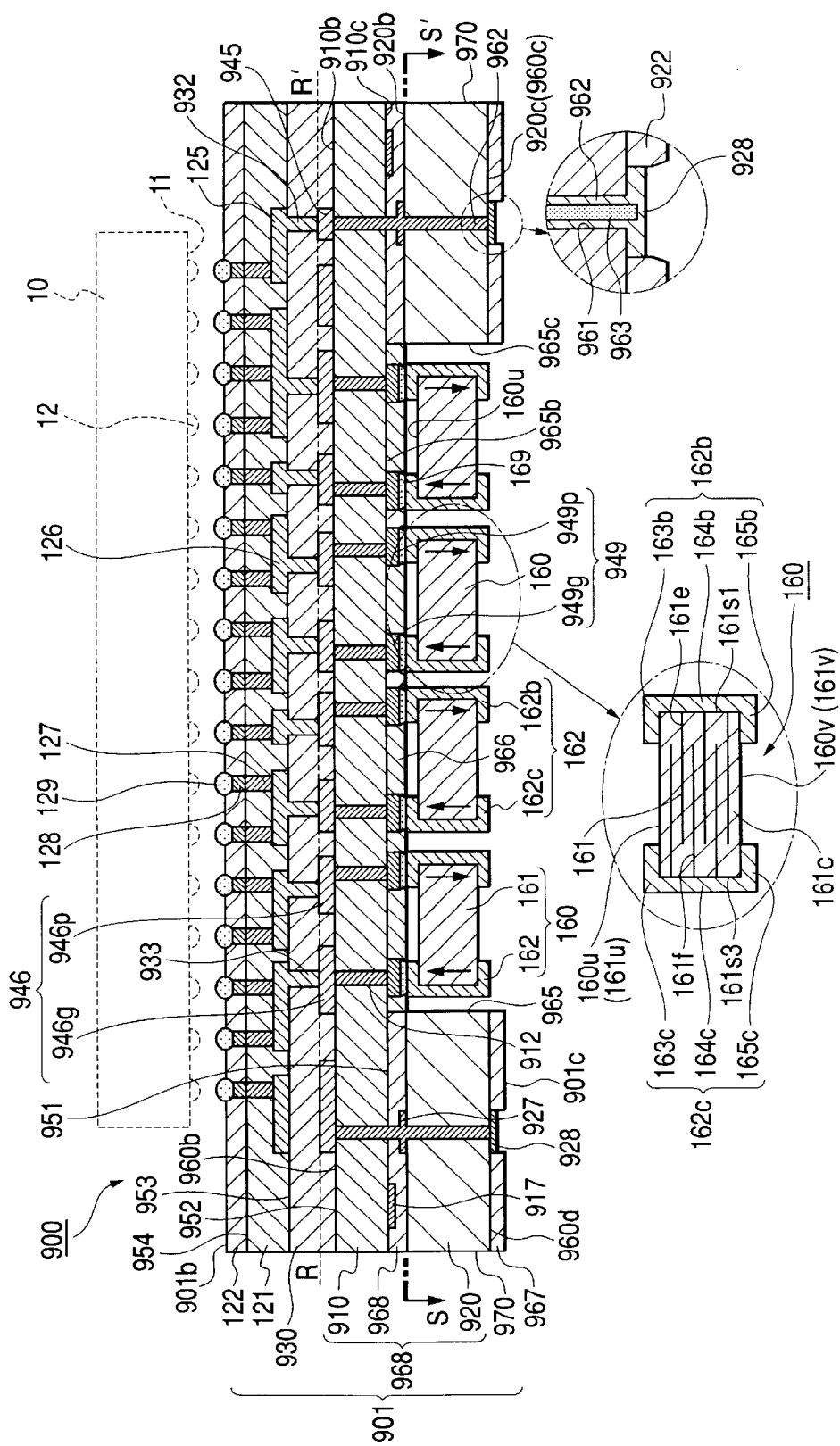
FIG. 16 is a sectional view of a wiring board according to Embodiment 3.

Referring to FIG. 16, Embodiment 3 of the invention will be described below. With regard to wiring for connecting the capacitor-connecting pads to the bumps (principal face side connecting terminals), the wiring board 900 according to this embodiment has substantially the same structure as that of the wiring board 100 according to any one of Embodiment 1 and Modifications 1 to 5.

In any one of Embodiment 1 and Modifications 1 to 5, capacitor-connecting pads are formed on the reverse face of the wiring board so that chip capacitors are mounted on the capacitor-connecting pads. On the contrary, in Embodiment 3, a cavity surrounding portion is formed on the reverse face side from the insulating layer so that the cavity surrounding portion is formed to be opened on the reverse face side and to constitute a wall face of a cavity, and capacitor-connecting pads are formed on a bottom face of the cavity so that chip capacitors are mounted in the cavity.

Specifically, as shown in FIG. 16, the wiring board 900 according to the invention has a wiring board main body 901, and chip capacitors 160. The chip capacitors 160 are like those in Embodiment 1 and description thereof will be omitted. In this embodiment, the wiring board main body 901 will be mainly described below.

The wiring board main body 901 includes: a core substrate 960 having a cavity 965 opened on the reverse face 901c side of the wiring board main body 901; and principal face side insulating resin layers 930 and 121, a converting-conductor layer 946 and wiring layers 125 and 126 laminated on a principal face 960b of the core substrate 960. The chip capacitors 160 are disposed in the cavity 965 so that upper faces 160u (first faces) of the chip capacitors are opposite to a bottom face 965b of the cavity 965.

The core substrate 960 in the wiring board 900 is constituted by a first core part 910 relatively thin and a second core part 920 relatively thick.

Figure 17:
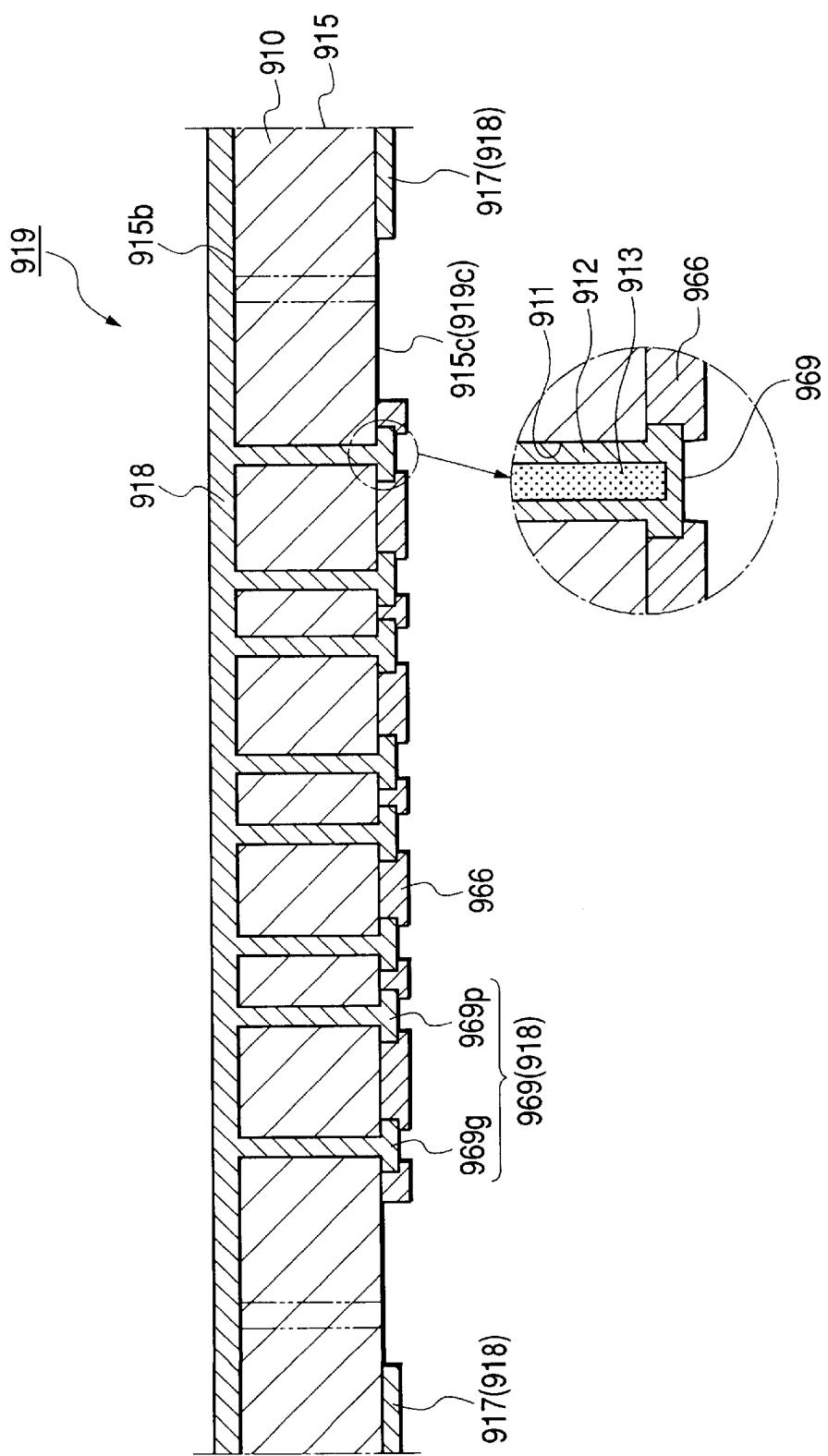
FIG. 17 is a sectional view of a first core substrate 919 in the wiring board 900 according to Embodiment 3.

The first core part 910 is made of a glass-epoxy resin having a rectangular shape with a size of 31 mm by 31 mm and a thickness of 200 μm. As shown in FIG. 17, a plurality of through-holes 911 each having a diameter of about 100 μm and piercing the first core part 910 in the thicknesswise direction are formed in a neighbor of the center of the first core part 910. A through-hole conductor 912 made of copper is formed in an inner wall of each of the through-holes 911. The inside of the inner wall of each of the through-holes 911 is filled with a plug resin 913. The second core part 920 (see FIG. 16) is made of a glass-epoxy resin having a rectangular shape with a size of 31 mm by 31 mm and a thickness of 800 μm. The cavity 965 is formed in a neighbor of the center of the second core part 920. The cavity 965 is shaped like a regular square with a size of 15 mm by 15 mm in front view.

The first and second core parts 910 and 920 are stuck onto each other through an adhesive layer 968 with a thickness of about 60 μm to thereby be laminated on each other to form the core substrate 960. As shown in left and right parts of FIG. 16, through-holes 961 each having a diameter of about 100 m and piercing the core substrate 960 in the thicknesswise direction are formed in surroundings (cavity surrounding portion 970) of the cavity 965 in the core substrate 960. Further, as shown enlargedly in FIG. 16, a through-hole conductor 962 is formed on an inner wall of each of the through-holes 961. The inside of the inner wall of each of the through-holes 961 is filled with a plug resin 963. Further, pads 928 connected to the through-hole conductors 962 respectively and a solder resist layer 967 are formed on a core reverse face 960c of the core substrate 960.

Further, capacitor-connecting pads 949 like the capacitor-connecting pads 149 in Embodiment 1 and a solder resist layer 966 made of an epoxy-based resin are formed on a bottom face 965b of the cavity 965. The capacitor-connecting pads 949 are connected to the through-hole conductors 912 respectively.

A converting-conductor layer 946 having the same pattern as that of the converting-conductor layer 146 in Embodiment 1 and a wiring layer 945 having the same pattern as that of the wiring layer 145 in Embodiment 1 are formed on the core principal face 960b of the core substrate 960. The converting-conductor layer 946 is connected to the through-hole conductors 912. The wiring layer 945 is connected to the through-hole conductors 962. A principal face side insulating resin layer 930 made of an epoxy-based resin and having a thickness of about 30 μm is formed on the core principal face 960b of the core substrate 960, the converting-conductor layer 946 and the wiring layer 945. Further, via-conductors 933 located in predetermined positions on the converting-conductor layer 946 and piercing the principal face side insulating resin layer 930 in the thicknesswise direction, and via-conductors 932 located in predetermined positions on the wiring layer 945 and piercing the principal face side insulating resin layer 930 in the thicknesswise direction are formed in the principal face side insulating resin layer 930 in the same manner as in Embodiment 1. Further, wiring layers 125 and 126 like those in Embodiment 1 are formed on the principal face side insulating resin layer 930. The wiring layer 125 is connected to the via-conductors 932. The wiring layer 126 is connected to the via-conductors 933. A principal face side insulating resin layer 121 like that in Embodiment 1 is formed on the principal face side insulating resin layer 930 and on the wiring layer 126.

Further, via-conductors 127 like those in Embodiment 1, located in predetermined positions on the wiring layers 125 and 126 and piercing the principal face side insulating resin layer 121 in the thicknesswise direction are formed in the principal face side insulating resin layer 121 in the same manner as in Embodiment 1. A solder resist layer 122 and pads 128 like those in Embodiment 1 are formed on the principal face side insulating resin layer 121. The pads 128 are connected to the via-conductors 127. Further, bumps 129 like those in Embodiment 1 are formed on the pads 128 respectively.

According to the wiring board 900 having the wiring board main body 901 as described above, the bumps 129 located in the substantially circumferential edge portion are connected to the wiring layer 125 through the pads 128 and the via-conductors 127 and fanned out to the circumferential edge side (right or left direction in FIG. 16) so as to be connected to the via-conductors 932 located in the circumferential edge portion, in the same manner as in Embodiment 1. The bumps 129 are further connected to the connecting pads 928 exposed out of the solder resist layer 967, through the wiring layer 945 and the through-hole conductors 962. For example, these may be mainly used as signal wiring or may be used as power supply wiring for supplying a plus power-supply potential and a ground potential.

Incidentally, the wiring layer 945 is preferably connected to the connecting pads 928 by the plurality of through-hole conductors 962 in order to reduce resistance and inductance generated in the through-hole conductors 962.

On the other hand, the bumps 129 located in the substantially center portion are connected, through the pads 128 and the via-conductors 127, to the via-conductors 933 located in the center portion, after the positions of the bumps 129 are adjusted by the wiring layer 126 formed in an interlayer 953 without fanning out, or after wiring (via-conductors 127) from the plurality of bumps 129 is collected, that is, after wiring is connected in parallel. This manner may be preferably used when the distance (for example, 600 μm at minimum) between adjacent via-conductors 933 is larger than the distance (for example, 150 μm at minimum) between adjacent bumps 129.

The bumps 129 are further connected to the converting-conductor layer 946 and to the capacitor-connecting pads 949 through the through-hole conductors 912 piercing the first core part 910. Accordingly, the bumps 129 are connected to electrodes 162 (162b and 162c) of the capacitors 160.

Incidentally, as shown in a left end of FIG. 16, some of the connecting pads 928 located on the reverse face 901c are connected to the converting-conductor layer 946 through the through-hole conductors 962. Through this path, a plus power-supply potential and a ground potential are supplied to the bumps 129 and the chip capacitors 160, respectively, located in the center portion. Alternatively, a plus power-supply potential and a ground potential may be supplied to the bumps 129 and the chip capacitors 160 located in the center portion, via the connecting pads 928, the through-hole conductors 962, the wiring layer 945, the via-conductors 932 and the wiring layers 125 and 126.

The converting-conductor layer 946 is formed in the same manner as in Embodiment 1 (see FIG. 4) to have a pattern in which first converting-conductor layer parts 946p connected to the plus power-supply potential (common first potential) and second converting-conductor layer parts 946g connected to the ground potential (common second potential) are disposed alternately so as to be striped. The relation between the converting-conductor layer 946 and terminals 162b and 162c of the chip capacitors 160, particularly between the converting-conductor layer 946 and upper face portions 163b and 163c of the terminals 162b and 162c and the relation between the converting-conductor layer 946 and the via-conductors 933 are like those in Embodiment 1. Hence, these relations will be described with reference to FIGS. 4, 5, 7 and 21.

Figure 21:
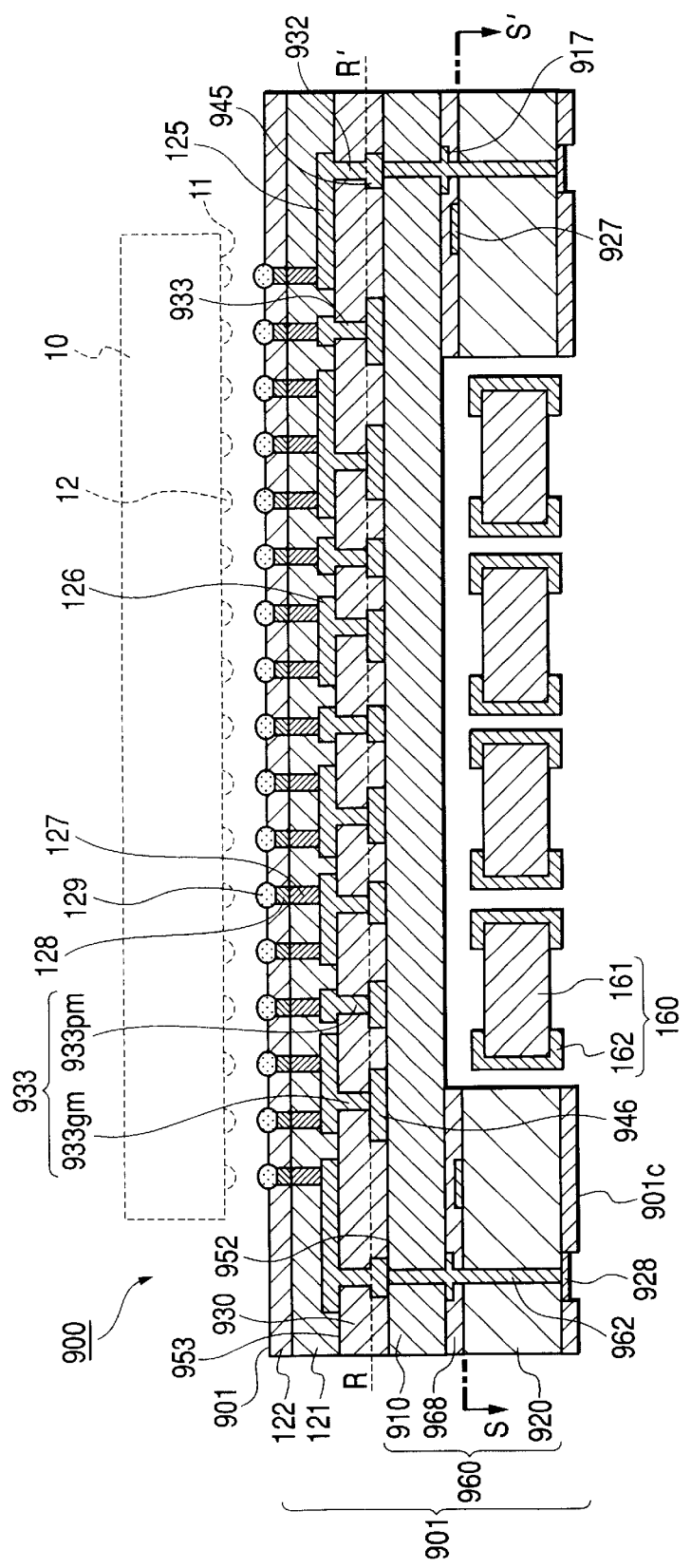
FIG. 21 is another sectional view of the wiring board according to Embodiment 3.
Figure 22:
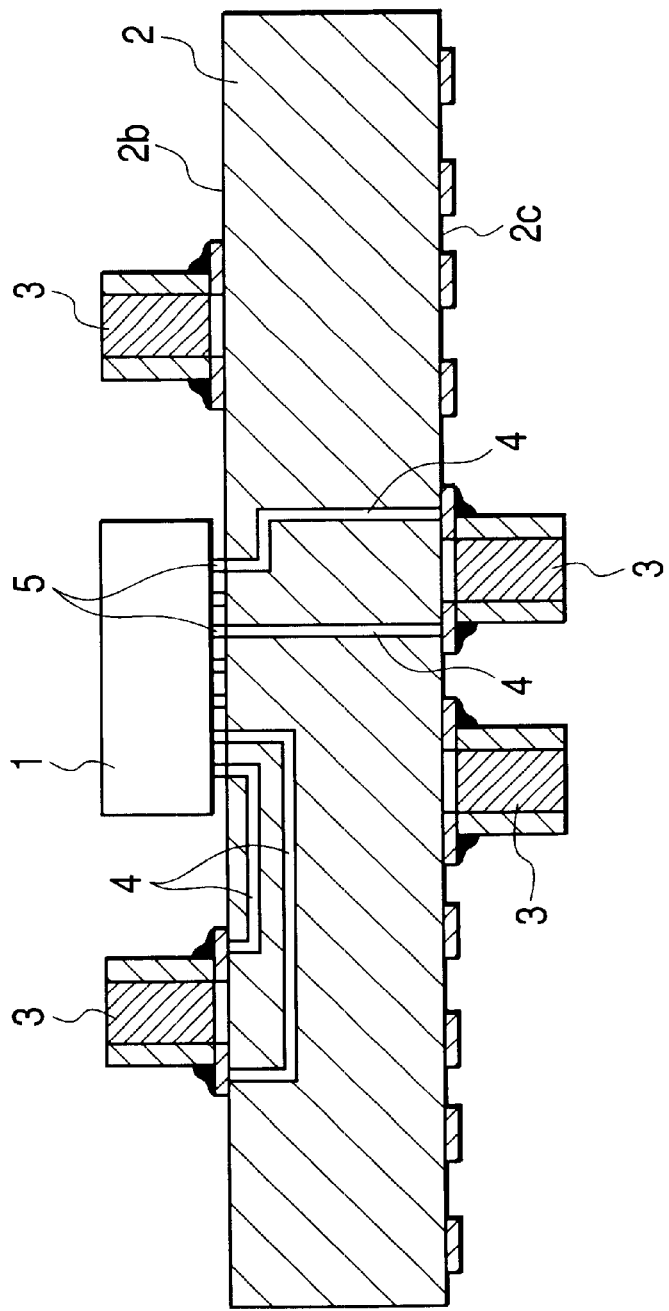
FIG. 22 is an explanatory view showing a conventional wiring board having principal and reverse faces on which chip capacitors are mounted.

FIG. 4 is a view of the chip capacitors 160 in an R–R' section in FIG. 16 or 21, viewed from the principal face 901b side through (or after removal of) the first core part 910, the solder resist layer 966, the capacitor-connecting pads 949, etc., that is, FIG. 4 is a view showing a state in which the converting-conductor layer 946 is projected from the principal face 901b side onto upper faces 160u in an S–S' section in FIG. 16. The converting-conductor layer 946 includes first converting-conductor layer parts 946p and second converting-conductor layer parts 946g. The first converting-conductor layer parts 946p and the second converting-conductor layer parts 946g are all shaped like belts and disposed alternately as a striped pattern, as represented by different kinds of hatching in FIG. 4.

Moreover, the first converting-conductor layer parts 946p are located above the terminals 162b (upper face parts 163b) connected to the plus power-supply potential (on the principal face 901b side) among the terminals 162 (upper face parts 163) of the chip capacitors 160 whereas the second converting-conductor layer parts 946g are located above the terminals 162c (upper face parts 163c) connected to the ground potential (on the principal face 901b side). Accordingly, the first converting-conductor layer parts 946p can be connected to the terminals 162b (upper face parts 163b) of the chip capacitors 160 below the first converting-conductor layer parts 946p (on the reverse face 901c side), through the very short through-hole conductors 912 piercing the first core part 910 and the first capacitor-connecting pads 949p (see FIG. 16).

Similarly, the second converting-conductor layer parts 946g can be connected to the terminals 162c (upper face parts 163c) below the second converting-conductor layer parts 946g, through the very short through-hole conductors 912 piercing the first core part 910 and the second capacitor-connecting pads 949g.

Hence, resistance and inductance generated between the converting-conductor layer 946 and the terminals 162 (upper face parts 163) of the capacitors 160 can be suppressed to be low.

Referring to FIG. 5, the connection relation between the converting-conductor layer 946 and the via-conductors 933 located closer to the principal face 901b side than the converting-conductor layer 946 will be described below. FIG. 5 is a view superposed on FIG. 4 and showing the connecting positions of the via-conductors 933 connected, from the principal face side, to the first and second converting-conductor layer parts 946p and 946g disposed to be striped. In FIG. 5, the encircled symbol p designates the position of each of the via-conductors 933p connected to the first converting-conductor layer parts 946p and the encircled symbol g designates the position of each of the via-conductors 933g connected to the second converting-conductor layer parts 946g. As will be understood easily from FIG. 5, in this embodiment, some via-conductors 933p and 933g are connected to the first and second converting-conductor layer parts 946p and 946g just above the terminals 162b and 162c (upper face parts 163b and 163c) (on the principal face 901b side) respectively. Incidentally, some via-conductors 933p and 933g are not connected just above the upper face parts 163b and 163c. An X–X' section in FIG. 5 corresponds to a sectional view shown in FIG. 16.

Portions between first converting-conductor layer parts 946p mediating between two terminals 162b (upper face parts 163b) in each of the chip capacitors 160, that is, specifically, intermediate connecting via-conductors 933pm are connected to the first converting-conductor layer parts 946p on the center line of each of the chip capacitors 160 regarded as being longer than is wide in plan view. Similarly, portions between second converting-conductor layer parts 946g mediating between two terminals 162c (upper face parts 163c) in each of the chip capacitors 160, that is, specifically, intermediate connecting via-conductors 933gm are connected to the second converting-conductor layer parts 946g on the center line of each of the chip capacitors 160 regarded as being longer than is wide in plan view. Incidentally, a Y–Y' section in FIG. 5 corresponds to a sectional view shown in FIG. 21

Because the first converting-conductor layer parts 946p and the second converting-conductor layer parts 946g are disposed alternately to be striped as described above, the bumps 129 can be easily connected to the converting-conductor layer 126 through the pads 128, the via-conductors 127, the wiring layer 126 and the via-conductors 933 when the positions of the bumps 129 are adjusted by the short wiring layer 126. Hence, the bumps 129 can be connected to the chip capacitors 160 by a short distance as well as either the plus power-supply potential or the ground potential can be easily led out to the bumps 129 through the via-conductors 933, the wiring layer 126, the via-conductors 127 and the pads 128.

Moreover, because the first and second converting-conductor layer parts 946p and 946g are formed in the interlayer 952 between the first core part 910 and the principal face side insulating resin layer 930, the number of required interlayers can be reduced so that the number of insulating resin layers in the wiring board main body 901 can be reduced by one layer compared with the case where two all-overlaying (plate-like) converting-conductor layers are used.

Assume further the case where the chip capacitors 160 are electrically discharged in the wiring board 900 in the same manner as in Embodiment 1, as shown in FIG. 7. That is, assume the case where a current is made to flow from the power-supply potential terminals 162*b* (upper face parts 163*b*) of the chip capacitors 160 to the IC chip 10 through the first converting-conductor layer parts 162*p* and the via-conductors 933*p* whereas a return current is made to flow from the IC chip 10 to the ground potential terminals 162*c* (upper face parts 163*c*) of the chip capacitors 160 through the via-conductors 933*g* and the second converting-conductor layer parts 946*g*. In this case, currents flowing from the first converting-conductor layer parts 946*p* into the intermediate connecting via-conductors 933*pm* and currents flowing out from the intermediate connecting via-conductors 933*gm* to the second converting-conductor layer parts 946*g* are represented by the arrows in FIG. 7.

Then, in current-reverse-flowing parts 41 enclosed in the chain single-dashed line in FIG. 7, the direction of the current flowing in the first converting-conductor layer parts 946*p* and the direction of the current flowing in the second converting-conductor layer parts 946*g* are reverse to each other. Accordingly, because mutual inductance becomes negative in the current-reverse-flowing parts so that inductance in the current-reverse-flowing parts can be suppressed, it is found that inductance generated in the converting-conductor layer 946 can be reduced more greatly, that is, inductance generated in the wiring board 900 (wiring board main body 901) as a whole can be reduced more greatly.

Moreover, in this embodiment, as will be easily understood from FIGS. 16 and 21, the number of via-conductors 933 connected to the converting-conductor layer 946 from the principal face 901*b* side and, accordingly, the number of bumps 129 connected thereto is larger than the number of through-hole conductors 912 connected to the converting-conductor layer 946 from the reverse face 901*c* side. Accordingly, because the converting-conductor layer 946 is provided in the interlayer 952, resistance and inductance generated between the chip capacitors 160 and the bumps 129 can be suppressed to be low as a whole compared with the case where a converting-conductor layer is provided in another interlayer 953.

Referring to FIGS. 17 through 20, the method of producing the wiring board main body 901 according to this embodiment will be described below. Incidentally, the method of producing the chip capacitor 160 is like that in Embodiment 1 and description thereof will be omitted.

First, a double-side copper-clad first core substrate main body 915 having a rectangular shape with a size of 31 mm by 31 mm and a thickness of about 200 $\mu$m and having a principal face 915*b* and a reverse face 915*c* both clad with copper foil in a thickness of about 16 $\mu$m is prepared (see FIG. 17). Then, as enlargedly shown in FIG. 17, through-holes 911 each having a diameter of about 100 $\mu$m are formed in predetermined positions of the first core substrate main body 915 by laser cutting or drilling. Then, copper electroless-plating and copper electro-plating are applied so that through-hole conductors 912 each having a thickness of about 30 $\mu$m are formed along inner walls of the through-holes 911 respectively and copper plating layers 918 are formed on the principal face 915*b* and the reverse face 915*c* respectively. Then, the inside of each of the through-hole conductors 912 is filled with an epoxy-based resin to thereby form a plug resin 913. The principal face 915*b* and the reverse face 915*c* are further wholly plated with copper so that cover plating is performed to cover the plug resin 913. The copper plating layer 918 on the reverse face 915*c* side is etched into a predetermined pattern to thereby form capacitor-connecting pads 969 and a wiring layer 917. Further, a solder resist layer 966 made of an epoxy-based resin is formed in a predetermined position on the reverse face 915*c*. In this manner, a first core substrate 919 including a first core part 910 is formed as shown in FIG. 17.

Figure 18A:
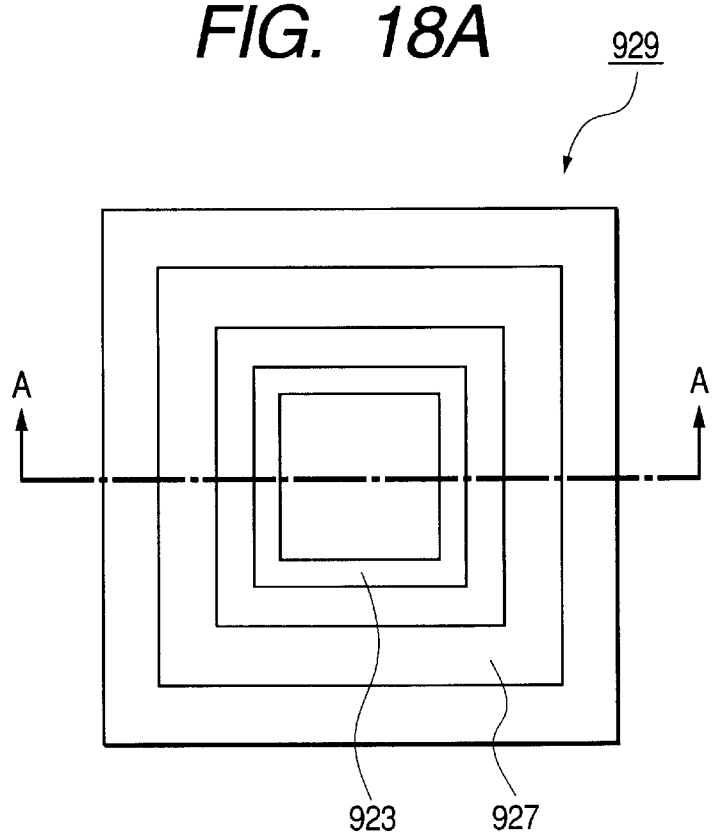
FIG. 18A is a top view showing a second core substrate 929 in the wiring board 900 according to Embodiment 3.
Figure 18B:
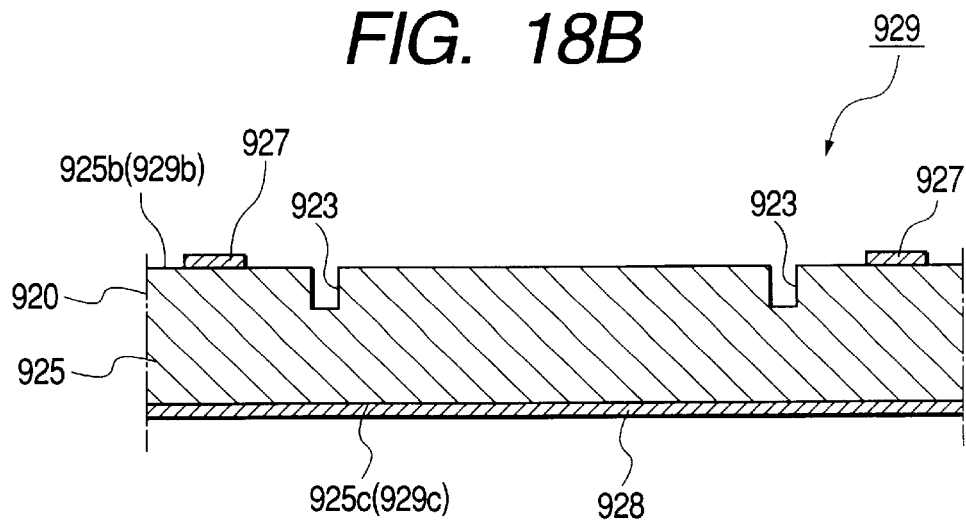
FIG. 18B is an enlarged sectional view taken along the line A—A in FIG. 18A.

On the other hand, a single-side copper-clad second core substrate main body 925 having a rectangular shape with a size of 31 mm by 31 mm and a thickness of about 800 $\mu$m and having a principal face 925*b* and a reverse face 925*c* both clad with copper foil in a thickness of about 16 $\mu$m as shown in FIGS. 18A and 18B is prepared. The principal face 925*b* side of the second core substrate main body 925 is countersunk by end-milling to thereby form U-grooves 923 in the center portion of the second core substrate main body 925. Each of the U-grooves 923 is shaped substantially like a "☐" figure in plan view as shown in FIG. 18A. Then, the copper foil on the principal face 925*b* side is etched to thereby form a wiring layer 927 around the U-grooves 923. In this manner, a second core substrate 929 including a second core part 920 is formed as shown in FIG. 18B.

Figure 19:
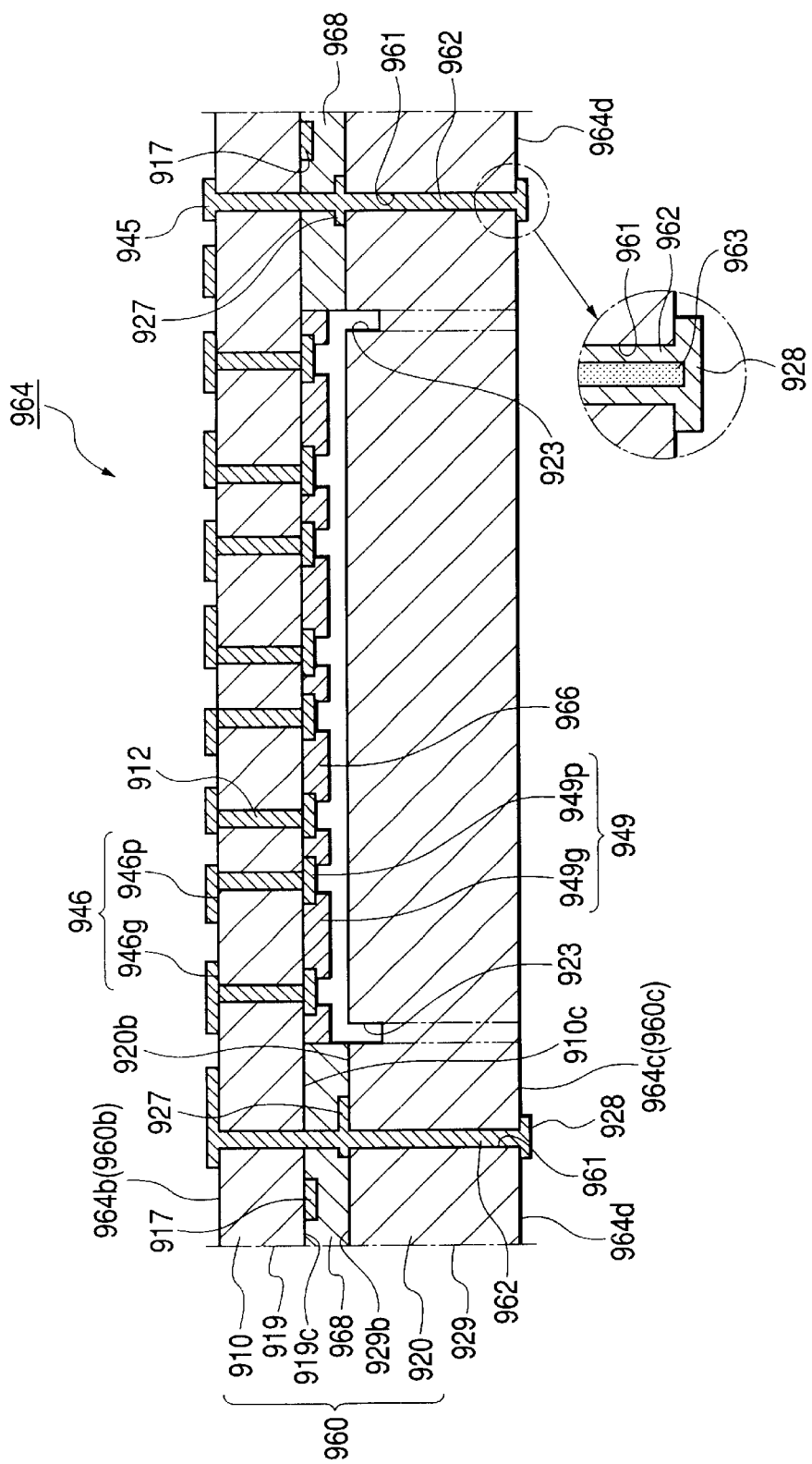
FIG. 19 is a sectional view of a core substrate main body 964 in the wiring board 900 according to Embodiment 3.

Then, as shown in FIG. 19, an adhesive layer 968 made of an adhesive prepreg is disposed between the reverse face 919*c* of the first core substrate 919 and the principal face 929*b* of the second core substrate 929 and hot-pressed to thereby bond and laminate the first and second core substrates 919 and 929 onto each other. Incidentally, on this occasion, a superfluous part of the adhesive layer 968 is received in the U-grooves 923 if the adhesive layer 968 is excessive. Then, holes are formed in predetermined positions of the circumferential edge portion of the core substrate by laser cutting or drilling to thereby form through-holes 961 each having a diameter of about 100 $\mu$m and piercing the core substrate in the thicknesswise direction.

Then, as shown in FIG. 19, copper electroless-plating and copper electro-plating are applied so that through-hole conductors 962 each having a thickness of about 30 $\mu$m are formed along inner walls of the through-holes 961 respectively and copper plating layers not shown are formed on the principal face 964*b* and the reverse face 964*c* respectively. Then, the inside of each of the through-hole conductors 962 is filled with an epoxy-based resin to thereby form a plug resin 963. The principal face 964*b* and the reverse face 964*c* are further wholly plated with copper to thereby perform cover plating to cover the plug resin 963. Then, the copper plating layer on the principal face 946*b* is etched into the same pattern as in Embodiment 1 to thereby form a converting-conductor layer 946 and a wiring layer 945. Further, the copper plating layer on the core reverse face 960*c* is etched in the same manner as in Embodiment 1 to thereby form pads 928. In this manner, a core substrate main body 964 is formed as shown in FIG. 19.

Figure 20:
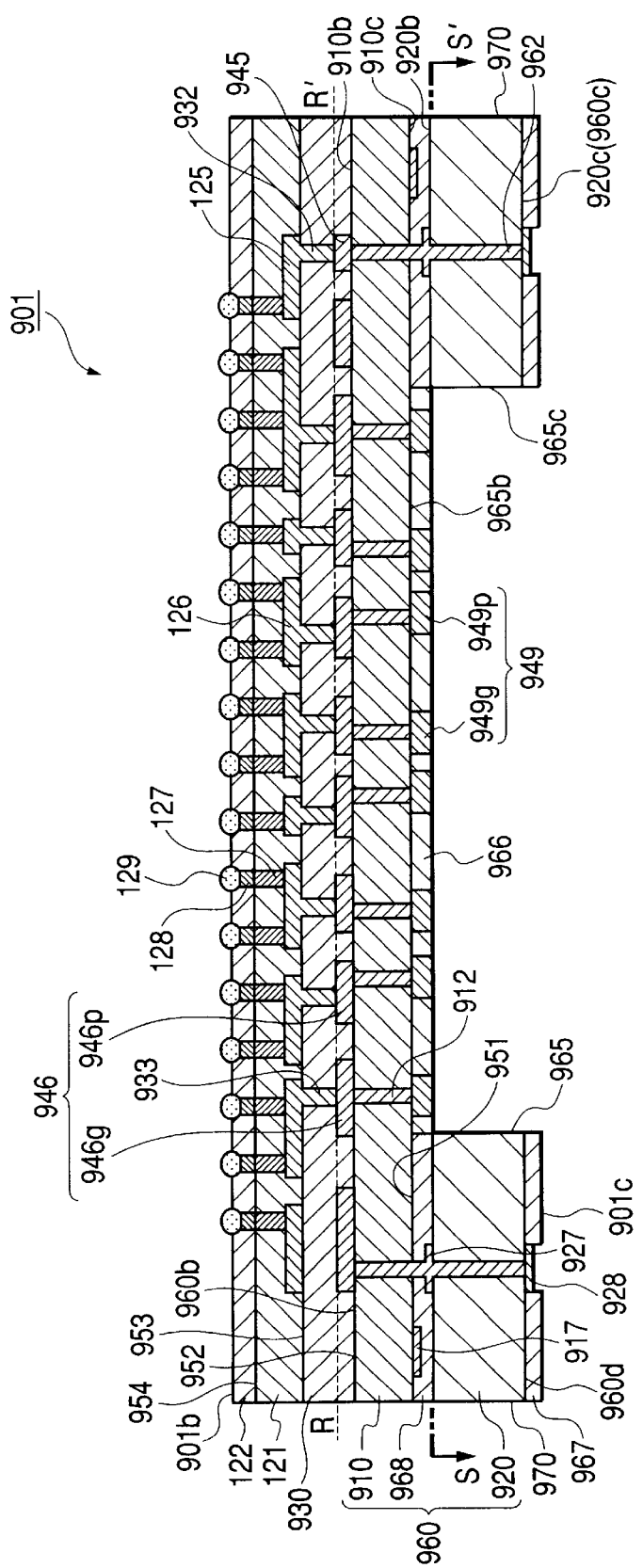
FIG. 20 is a sectional view of a wiring board main body 901 in the wiring board 900 according to Embodiment 3.

Then, reverse faces 964*c* of two core substrate main bodies 964 are stuck onto each other through unnecessary portions 964*d* (left and right lower faces in FIG. 19) outer than the outer circumferential edges to thereby prepare a pair of core substrate main bodies 964 not shown. Then, the following step is performed simultaneously on the two principal faces 964*b* (960*b*) of the pair of core substrate main bodies 964. First, as shown in FIG. 20, a principal face side insulating resin layer 930 is formed on each of the principal faces 964b (960b). Then, via-conductors 933 are formed in predetermined positions on the converting-conductor layer 946 in the same manner as in Embodiment 1. Similarly, a wiring layer 126, a principal face side insulating resin layer 121, via-conductors 127, pads 128 and a solder resist layer 122 are formed successively by a known build-up method. Then, solder paste is applied on the pads 128 and reflow soldering is performed at a temperature lower than the melting temperature of the solder paste to thereby form bumps 129.

The reason why sticking of two core substrate main bodies 964 onto each other and lamination of insulating resin layers or the like are performed simultaneously is that sticking of the two core substrate main bodies 964 can prevent the boards from being warped when the insulating resin layers or the like are laminated.

Then, the pair of core substrate main bodies 964 are separated from each other at the unnecessary portions through which the pair of core substrate main bodies 964 are stuck onto each other. That is, the pair of core substrate main bodies 964 on which insulating resin layers or the like are laminated are separated from each other. Then, a solder resist layer 967 having a predetermined pattern is formed on the reverse face 964c of the core substrate main body 964. Then, U-grooves (represented by the chain double-dashed line) are formed by end-milling on the reverse side of the U-grooves 923 from the reverse face 964c of the core substrate main body 964 as represented by the chain double-dashed line in FIG. 19. The center portion of the second core substrate 929 is cut off and removed to thereby form a cavity 965. (On this occasion, the core substrate main body 964 is formed as a core substrate 960.) In this manner, a wiring board main body 901 as shown in FIG. 21 is completed.

As described above, the wiring board main body 901 is formed by the steps of: laminating a second core substrate 929 thick on a first core substrate 919 thin through an adhesive layer 968 to thereby form a core substrate main body 964; and laminating an insulating resin layer and a wiring layer on a principal face 964b of the core substrate main body 964 formed in this manner to have sufficient strength. Accordingly, even in the case where an insulating resin layer is laminated only on a single face of the core substrate main body 964, the wiring board main body 901 can be produced inexpensively without conventional necessity of attaching any reinforcing material.

Then, chip capacitors 160 are disposed in the cavity 965 of the wiring board main body 901. Upper face parts 163b (first terminals) of terminals 162b are connected to the first capacitor-connecting pads 949p respectively. Upper face parts 163c (second terminals) of terminals 162c are connected to the second capacitor-connecting pads 949g respectively. In this manner, a wiring board 900 is completed. Then, the cavity 965 may be filled with a resin to embed the capacitors 160 in the resin while lower face parts 165b of the terminals 162b and lower face parts 165c of the terminals 162c are exposed.

In the wiring board 900, total inductance in the capacitors 160 mounted can be reduced because the plurality of chip capacitors 160 are connected in parallel to one another as well as noise can be eliminated steadily because such a large number of chip capacitors 160 are mounted in the same manner as in Embodiment 1. Moreover, in each of the chip capacitors 160, the terminals 162 adjacent to and opposite to each other are different in polarity from each other, so that directions of currents flowing in the terminals 162 are reverse to each other. Hence, inductance can be reduced more greatly, so that the capacitors 160 can be connected to the IC chip 10 with lower inductance.

In the wiring board 900, the chip capacitors 160 re mounted in the cavity 965. Hence, the chip capacitors 160 are mounted substantially opposite to the IC chip 10 mounted on the principal face 901b so that the bottom face 965b of the cavity 965 is interposed between the IC chip 10 and the chip capacitors 160. For this reason, the distance between connecting terminals (bumps) on the principal face side of the wiring board and the first and second terminals (upper face parts) of the chip capacitors can be shortened and, accordingly, the distance between the IC chip mounted on the principal face and the chip capacitors can be shortened compared with the double-side laminated wiring board having no cavity.

Accordingly, the connecting terminals (bumps) on the principal face side of the wiring board can be connected to the first and second terminals (upper face parts) of the chip capacitors by short paths compared with the double-side laminated wiring board having no cavity, so that resistance components and inductance components generated on these paths can be suppressed.

Although the invention has been described above in connection with Embodiments 1, 2 and 3 and Modifications 1 to 5, it is a matter of course that the invention is not limited to the embodiments and modifications and that various changes may be made without departing from the gist of the invention.

For example, though Embodiments 1, 2 ad 3 have shown the case where a solder resist layer 122, 822, 966 and a solder resist layer 142, 842, 967 are formed on the principal dace side insulating resin layer (on the IC chip side) and on the reverse face side insulating resin layer (on the chip capacitor side) respectively, the invention may be applied also to the case where the wiring board is produced without having any solder resist layer formed.

Although Embodiments 1 and 2 have shown the case where one principal face side insulating resin layer 121, 821 and one reverse face side insulating resin layer 141, 841 are formed on upper and lower sides of a core substrate main body 111, 811, the invention may be applied also to a wiring board in which a larger number of insulating resin layers are laminated. Although Embodiment 3 has similarly shown the case where principal face side insulating resin layers 930 and 121 are formed on the core principal face 960b of the core substrate 960, the invention may be applied also to a wiring board in which a larger number of principal face side insulating resin layers are laminated. Although description has been made upon the case where no reverse face side insulating layer is formed on the reverse face 920c of the second core substrate 920, the invention may be applied also to a wiring board in which a plurality of reverse face side insulating layers are laminated.

Embodiments 1, 2 and 3 have shown the case where the power-supply potential and the ground potential are supplied to the chip capacitors 160 and the bumps 129 and 829 through the connecting pads 148 and 928 formed in the circumferential edge portion on the reverse face 101c, 801c and 901c side from a mother board or the like not shown. The terminals 162 (lower face parts 164) of the chip capacitors 160, however, may be connected directly to terminals of the mother board or the like so that the power-supply potential and the ground potential can be supplied to the chip capacitors 160 and the bumps 129 and 829.

Although Embodiments and Modifications have shown the case where the converting-conductor layer is formed as a striped pattern in which first converting-conductor layer parts and second converting-conductor layer parts are disposed alternately throughout the converting-conductor layer, the invention may be applied also to the case where a part of the converting-conductor layer is formed as a striped pattern.

Embodiments 2 and 3 have shown the case where the converting-conductor layers 849 and 946 are patterned in the same manner as in Embodiment 1. Even in the wiring board 800 shown in Embodiment 2 and in the wiring board 900 shown in Embodiment 3, however, another pattern may be used as the pattern of each of the converting-conductor layers 849 and 946. For example, the pattern shown in Modification 1 may be used. Further, the form of the chip capacitors may be changed variously. For example, the patterns of the chip capacitors and the converting-conductor layer as shown in each of Modifications 2, 3, 4 and 5 may be used as the patterns of the chip capacitors and the converting-conductor layer used in each of Embodiments 2 and 3.

Although Embodiments 1 and 2 have shown the case where a core substrate main body 111, 811 is used as a center insulating layer of the wiring board 100 or the like, the invention may be applied also to a wiring board using no core substrate main body 111.

Although Embodiments 1 and 2 have shown the case where a converting-conductor layer 146, 849 is formed on the reverse face side (lower side in the drawings) of the core substrate main body 111, 811, the invention may be applied also to the case where such a converting-conductor layer is formed on the principal face side (upper side in the drawings), for example, on the upper face 111b of the core substrate main body 111 or in an interlayer between principal face side insulating resin layers or between a principal face side insulating resin layer and a solder resist layer. Although Embodiment 3 has similarly shown the case where the converting-conductor layer 946 is formed in the interlayer 952 (on the principal face 910b of the first core part 910), the invention may be applied also to the case where the converting-conductor layer 946 is formed in another interlayer, for example, an interlayer 951.

Although Embodiments 1, 2 and 3 have shown the case where the distance between adjacent through-hole conductors 113, via-conductors 933 or the like formed in the core substrate main body 111, the principal face side insulating resin layer 930 or the like is larger than the distance between adjacent bumps 129 or 829, the invention may be applied also to the case where the distance between adjacent through-hole conductors is substantially equal to the distance between adjacent bumps.

Further, Embodiment 2 has shown the case where the relative positions of the via-conductors 827 and the through-hole conductors 813 are adjusted by the wiring layer 826 formed on the upper face 811b (interlayer 151) of the core substrate main body 811 to thereby connect the via-conductors 847 to the converting-conductor layer 849 without necessity of positional adjustment of the through-hole conductors 813 and the via-conductors 847. The positional adjustment of the through-hole conductors 813 and the via-conductors 847, however, may be performed by the wiring layer 846 or may be performed by the two wiring layers 826 and 846.

This application is based on Japanese Patent application JP 2000-402498, filed Dec. 28, 2000 and JP 2001-367688, filed Nov. 30, 2001, the entire content of which is hereby incorporated by reference, the same as if set forth at length.

What is claimed is:

1. A wiring board having a principal face and a reverse face, which comprises:

i) a plurality of principal-face-side connecting terminals formed on the principal face side, wherein the principal-face-side connecting terminals are capable of being connected to terminals, respectively, of an electronic part to be mounted on the principal face side;

ii) at least one chip capacitor having a first electrode and a second electrode, wherein the chip capacitor is mounted on the reverse face side, and comprises: a first face facing to the reverse face; at least one first terminal that is formed on the first face and connected to the first electrode; and at least one second terminal that is formed on the first face and connected to the second electrode;

iii) at least one first capacitor-connecting terminal formed on the reverse face side, wherein the first capacitor-connecting terminal is connected to the first terminal;

iv) at least one second capacitor-connecting terminal formed on the reverse face side, wherein the second capacitor-connecting terminal is connected to the second terminal;

v) a plurality of insulating layers interposed between the principal-face-side connecting terminals, and the at least one first capacitor-connecting terminal and the at least one second capacitor-connecting terminal disposed on the reverse side;

vi) at least one first converting-conductor layer formed at an interlayer between adjacent two insulating layers, wherein the first converting-conductor layer is electrically connected to a plurality of the principal-face-side connecting terminals at the principal face side, is electrically connected to at least one of the first capacitor-connecting terminals at the reverse face side, and converts a connecting position and a connecting number between the principal face side and the reverse face side; and vii) at least one second converting-conductor layer formed at the interlayer, wherein the second converting-conductor layer is insulated from the first converting-conductor layer, is electrically connected to a plurality of the principal-face-side connecting terminals at the principal face side, is electrically connected to at least one of the second capacitor-connecting terminals at the reverse face side, and converts a connecting position and a connecting number between the principal face side and the reverse face side.

2. The wiring board according to claim 1, wherein the interlayer is an interlayer nearest to the at least one first capacitor-connecting terminal and the at least one second capacitor-connecting terminal, and the number of the principal-face-side connecting terminals electrically connected to one of the first converting-conductor layer and the second converting-conductor layer is more than the sum of:

the number of the first capacitor-connecting terminal electrically connected to the first converting-conductor layer; and the number of the second capacitor-connecting terminal electrically connected to the second converting-conductor layer.

3. The wiring board according to claim 2, wherein the first capacitor-connecting terminal electrically connected to the first converting-conductor layer from the reverse face side is positioned at least partly within a region formed by projecting the first converting-conductor layer in the direction of the first face, the first capacitor-connecting terminal and the first converting-conductor layer are connected through a via-conductor penetrating through the insulating layers, the second capacitor-connecting terminal electrically connected to the second converting-conductor layer from the reverse face side is positioned at least partly within a region formed by projecting the second converting-conductor layer in the direction of the first face, and the second capacitor-connecting terminal and the second converting-conductor layer are connected through a via-conductor penetraing through the insulating layers.

4. The wiring board according to claim 1, wherein the first capacitor-connecting terminal electrically connected to the first converting-conductor layer at the reverse face side is positioned at least partly within a region formed by projecting the first converting-conductor layer in the direction of the first face, the first capacitor-connecting terminal and the first converting-conductor layer are connected through a via-conductor penetrating through the insulating layers, the second capacitor-connecting terminal electrically connected to the second converting-conductor layer from the reverse face side is positioned at least partly within a region formed by projecting the second converting-conductor layer in the direction of the first face, and the second capacitor-connecting terminal and the second converting-conductor layer are connected through a via-conductor penetrating through the insulating layers.

5. The wiring board according to claim 1, wherein the first converting-conductor layer and the second converting-conductor layer are alternately arranged so as to form a stripe pattern.

6. The wiring board according to claim 5, wherein, in the stripe pattern, the current flowing of the first converting-conductor layer is opposite to the current flowing of the second converting-conductor layer in the direction at the time that the chip capacitor charges or discharges.

7. The wiring board according to claim 1, wherein layer of the first electrode and layers of the second electrode are alternately laminated parallel to the first face, via a high dielectric ceramic layer.

8. The wiring board according to claim 1, further comprising a cavity surrounding portion which is located nearer the reverse face than the insulating layer and which constitutes a wall face of a cavity opened onto the reverse face side, wherein:

the first and second capacitor-connecting terminals are formed on a bottom face of the cavity; and the chip capacitor is mounted in the cavity so that the bottom face of the cavity is facing to the first face of the chip capacitor.

9. The wiring board according to claim 8, further comprising a core substrate comprising a first core part located on the principal face side, and a second core part located nearer the reverse face than the first core part, wherein:

the first core part is contained in the insulating layer, and the second core part is contained in the cavity surrounding portion;

the insulating layer includes the first core part located on the most-reverse face side and at least one insulating resin layer laminated nearer the principal face than the first core part; and the cavity surrounding portion includes the second core part, and either no reverse face side insulating layer or reverse face side insulating layers provided on the reverse face side of the second core part so that a number of the reverse face side insulating layers is smaller than a number of the insulating resin layers.

10. A wiring board having a principal face and a reverse face, which comprises:

i) a plurality of principal-face-side connecting terminals formed on the principal face side, wherein the principal-face-side connecting terminals are capable of being connected to terminals, respectively, of an electronic part to be mounted on the principal face side;

ii) at least one chip capacitor having a first electrode and a second electrode, wherein the chip capacitor is mounted on the reverse face side, and comprises: a first face facing to the reverse face; at least one first terminal that is formed on the first face and connected to the first electrode; and at least one second terminal that is formed on the first face and connected to the second electrode;

iii) a plurality of insulating layers interposed between the principal-face-side connecting terminals, and the at least one first terminal and the at least one second terminal, the insulating layers comprising a most-reverse face side insulating layer that is a layer nearest to the reverse face;

iv) at least one first converting-conductor layer formed on a surface of the most-reverse face side insulating layer, the surface facing to the reverse face, wherein the first converting-conductor layer is electrically connected to a plurality of the principal-face-side connecting terminals at the principal face side, is connected or is electrically connected through a conductive connecting material to at least one of the first terminals at the reverse face side, and converts a connecting position and a connecting number between the principal face side and the reverse face side; and v) at least one second converting-conductor layer formed on the surface, wherein the second converting-conductor layer is insulated from the first converting-conductor layer, is electrically connected to a plurality of the principal-face-side connecting terminals at the principal face side, is connected or is electrically connected through a conductive connecting material to at least one of the second terminals at the reverse face side, and converts a connecting position and a connecting number between the principal face side and the reverse face side.

11. The wiring board according to claim 10, wherein the number of the principal-face-side connecting terminals electrically connected to one of the first converting-conductor layer and the second converting-conductor layer is more than the sum of:

the number of the first terminal electrically connected to the first converting-conductor layer; and the number of the second terminal electrically connected to the second converting-conductor layer.

12. The wiring board according to claim 10, wherein the first converting-conductor layer and the second converting-conductor layer are alternately arranged so as to form a stripe pattern.

13. The wiring board according to claim 12, wherein, in the stripe pattern, the current flowing of the first converting-conductor layer is opposite to the current flowing of the second converting-conductor layer in the direction at the time that the chip capacitor charges or discharges.

14. The wiring board according to claim 10, wherein layer of the first electrode and layers of the second electrode are alternately laminated parallel to the first face, via a high dielectric ceramic layer.

15. The wiring board according to claim 10, further comprising a cavity surrounding portion which is located nearer the reverse face than the insulating layer and which constitutes a wall face of a cavity opened onto the reverse face side, wherein:

the first and second capacitor-connecting terminals are formed on a bottom face of the cavity; and the chip capacitor is mounted in the cavity so that the bottom face of the cavity is facing to the first face of the chip capacitor.

16. The wiring board according to claim 15, further comprising a core substrate comprising a first core part located on the principal face side, and a second core part located nearer the reverse face than the first core part, wherein:

the first core part is contained in the insulating layer, and the second core part is contained in the cavity surrounding portion;

the insulating layer includes the first core part located on the most-reverse face side and at least one insulating resin layer laminated nearer the principal face than the first core part; and the cavity surrounding portion includes the second core part, and either no reverse face side insulating layer or reverse face side insulating layers provided on the reverse face side of the second core part so that a number of the reverse face side insulating layers is smaller than a number of the insulating resin layers.

* * * * *